(12) United States Patent
Nakamura et al.

(10) Patent No.: US 12,142,678 B2
(45) Date of Patent: Nov. 12, 2024

(54) SEMICONDUCTOR DEVICE

(71) Applicant: Nuvoton Technology Corporation Japan, Kyoto (JP)

(72) Inventors: Hironao Nakamura, Osaka (JP); Ryosuke Okawa, Nara (JP); Eiji Yasuda, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/699,821

(22) PCT Filed: Feb. 10, 2023

(86) PCT No.: PCT/JP2023/004664
§ 371 (c)(1),
(2) Date: Apr. 9, 2024

(87) PCT Pub. No.: WO2023/162735
PCT Pub. Date: Aug. 31, 2023

(65) Prior Publication Data
US 2024/0332416 A1   Oct. 3, 2024

Related U.S. Application Data

(60) Provisional application No. 63/313,320, filed on Feb. 24, 2022.

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0696* (2013.01); *H01L 29/086* (2013.01); *H01L 29/4236* (2013.01)

(58) Field of Classification Search
CPC ............ H01L 29/7813; H01L 29/0696; H01L 29/086; H01L 29/4236
(Continued)

(56) References Cited

U.S. PATENT DOCUMENTS

| 2012/0061753 A1 | 3/2012 | Nishiwaki |
| 2014/0264432 A1 | 9/2014 | Cotorogea et al. |

(Continued)

FOREIGN PATENT DOCUMENTS

| JP | 2012-059943 A | 3/2012 |
| JP | 2013-214696 A | 10/2013 |

(Continued)

OTHER PUBLICATIONS

International Search Report dated Apr. 25, 2023 issued in International Patent Application No. PCT/JP2023/004664, with English translation.

(Continued)

Primary Examiner — Igwe U Anya
(74) Attorney, Agent, or Firm — Rimon P.C.

(57) ABSTRACT

A semiconductor device includes a vertical field-effect transistor including: a first gate trench and a second gate trench extending in a first direction, the second gate trench being deeper than the first trench; a first gate insulating film and a first gate conductor inside the first gate trench; and a second gate insulating film and a second gate conductor inside the second gate trench. The first gate conductor and the second gate conductor have the same potential. When a total number of first gate trenches is denoted by n, a total number of second gate trenches is at least 2 and at most n+1. In a second direction orthogonal to the first direction, the second gate trench is disposed at each of farthest ends of a region in which the first gate trenches and the second gate trenches are disposed.

7 Claims, 17 Drawing Sheets

(51) Int. Cl.
*H01L 29/08* (2006.01)
*H01L 29/423* (2006.01)

(58) Field of Classification Search
USPC .......................................................... 257/330
See application file for complete search history.

(56) References Cited

U.S. PATENT DOCUMENTS

| | | |
|---|---|---|
| 2015/0115314 A1 | 4/2015 | Arakawa et al. |
| 2016/0336404 A1 | 11/2016 | Naito |
| 2018/0308963 A1 | 10/2018 | Kaneda et al. |
| 2019/0312113 A1 | 10/2019 | Chen |
| 2019/0319126 A1* | 10/2019 | Matsushima ....... H01L 21/6835 |
| 2021/0202723 A1* | 7/2021 | Chen .................... H01L 29/404 |
| 2022/0352145 A1* | 11/2022 | Takuma .............. H01L 29/0696 |

FOREIGN PATENT DOCUMENTS

| | | |
|---|---|---|
| JP | 2016-219774 A | 12/2016 |
| JP | 2018-182240 A | 11/2018 |
| JP | 6509674 B2 | 5/2019 |
| JP | 2019-186318 A | 10/2019 |
| WO | 2018/123799 A1 | 7/2018 |

OTHER PUBLICATIONS

Decision to Grant a Patent dated Oct. 31, 2023 issued in the corresponding Japanese Patent Application No. 2023-544601, with English translation.

\* cited by examiner

Portion having high electric field strength

Portion having high electric field strength

Portion having high electric field strength

SEMICONDUCTOR DEVICE

CROSS-REFERENCE OF RELATED APPLICATIONS

This application is the U.S. National Phase under 35 U.S.C. § 371 of International Patent Application No. PCT/JP2023/004664, filed on Feb. 10, 2023, which in turn claims the benefit of U.S. Provisional Patent Application No. 63/313,320, filed on Feb. 24, 2022, the entire disclosures of which Applications are incorporated by reference herein.

TECHNICAL FIELD

The present disclosure relates to a semiconductor device and, in particular, to a chip-size-package type semiconductor device.

BACKGROUND ART

It has been known that vertical field-effect transistors including gate trenches have a trade-off between a breakdown voltage and on resistance.

CITATION LIST

Patent Literature

[PTL 1] Japanese Unexamined Patent Application Publication No. 2016-219774
[PTL 2] Japanese Patent No. 6509674

SUMMARY OF INVENTION

Technical Problem

There has been a demand for vertical field-effect transistors including gate trenches to reduce on resistance while maintaining a breakdown voltage, and to improve tolerance to a decrease in reliability by reducing electric field strength occurring in the proximity of tips of the gate trenches when a voltage is applied between a drain and a source.

Patent Literatures (PTLs) 1 and 2 disclose the structure of a vertical field-effect transistor and show the structure that improves characteristics in trade-off.

Solution to Problem

In order to solve the above problem, a semiconductor device according to the present disclosure is a facedown mountable, chip-size-package type semiconductor device, the semiconductor device field-effect transistor including: a comprising: a vertical semiconductor substrate of a first conductivity type that contains an impurity of the first conductivity type; a low-concentration impurity layer of the first conductivity type that is disposed on the semiconductor substrate and contains an impurity of the first conductivity type having a concentration lower than a concentration of the impurity of the first conductivity type contained in the semiconductor substrate; a body region of a second conductivity type that is disposed in the low-concentration impurity layer, the second conductivity type being different from the first conductivity type; a source region of the first conductivity type that is disposed in the body region; a source electrode that is electrically connected to the body region and the source region; a first gate trench that penetrates through the body region from a top surface of the low-concentration impurity layer to a depth that reaches a portion of the low-concentration impurity layer, includes a portion in contact with the source region, and extends in a first direction parallel to the top surface of the low-concentration impurity layer; a second gate trench that penetrates through the body region from the top surface of the low-concentration impurity layer more deeply than the first gate trench, includes a portion in contact with the source region, and extends in the first direction; a first gate insulating film that is disposed inside the first gate trench; a first gate conductor that is disposed on the first gate insulating film; a second gate insulating film that is disposed inside the second gate trench; and a second gate conductor that is disposed on the second gate insulating film, wherein the first gate conductor and the second gate conductor have a same electric potential, when a total number of first gate trenches each of which is the first gate trench is denoted by n, a total number of second gate trenches each of which is the second gate trench is at least 2 and at most n+1, n being an integer greater than or equal to 1, and in a second direction that is parallel to the top surface of the low-concentration impurity layer and orthogonal to the first direction, the second gate trench is disposed at each of farthest ends of a region in which the first gate trenches and the second gate trenches are disposed.

This configuration makes it possible to reduce on resistance and improve, when a voltage is applied between a drain and a source, tolerance to electric field strength that causes a decrease in reliability.

Advantageous Effects of Invention

The present disclosure has an object to provide a semiconductor device that makes it possible to reduce on resistance while maintaining a breakdown voltage, and to achieve improvement in reliability.

DESCRIPTION OF EMBODIMENTS

Hereinafter, specific examples of a semiconductor device according to one aspect of the present disclosure are described with reference to the drawings. Each of the embodiments described below shows a specific example of the present disclosure. Therefore, numerical values, shapes, constituent elements, the arrangement and connection of the constituent elements, steps (processes), the processing order of the steps, etc. shown in the following embodiments are mere examples, and are not intended to limit the present disclosure. Moreover, the respective figures are schematic diagrams and are not necessarily precise illustrations. In the respective figures, substantially identical constituent elements are given the same reference signs, and overlapping descriptions are omitted or simplified.

Embodiment 1

[1. Structure of Semiconductor Device]

Hereinafter, a vertical field-effect transistor according to the present disclosure is described with a dual configuration as an example. A vertical field-effect transistor need not include a dual configuration, and may include a single configuration or at least a triple configuration.

Figure 1:
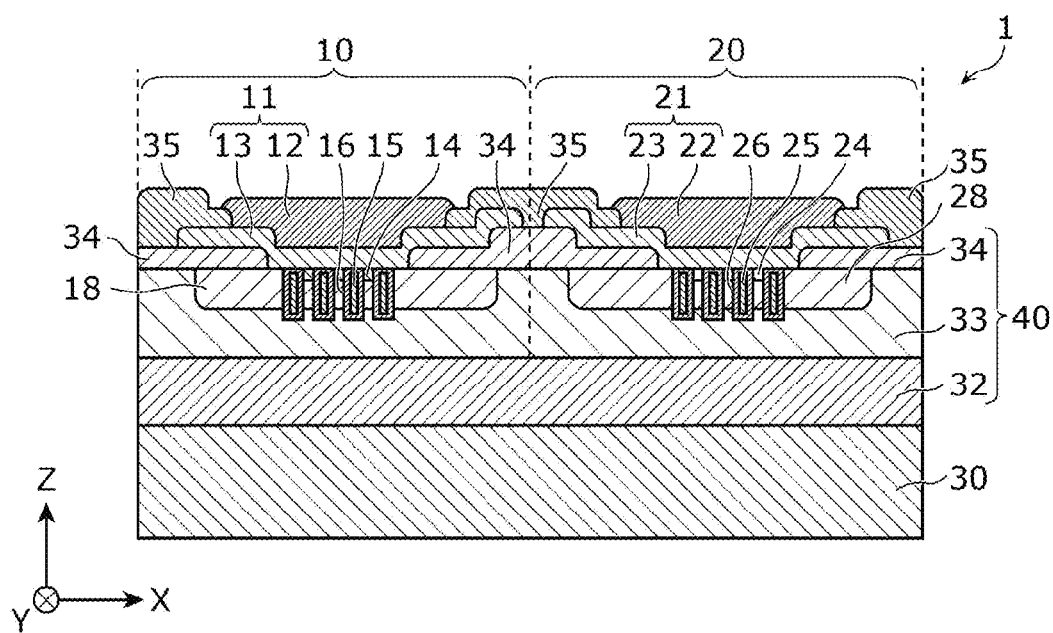
FIG. 1 is a schematic cross-sectional view showing an example of a structure of a semiconductor device according to Embodiment 1.
Figure 2A:
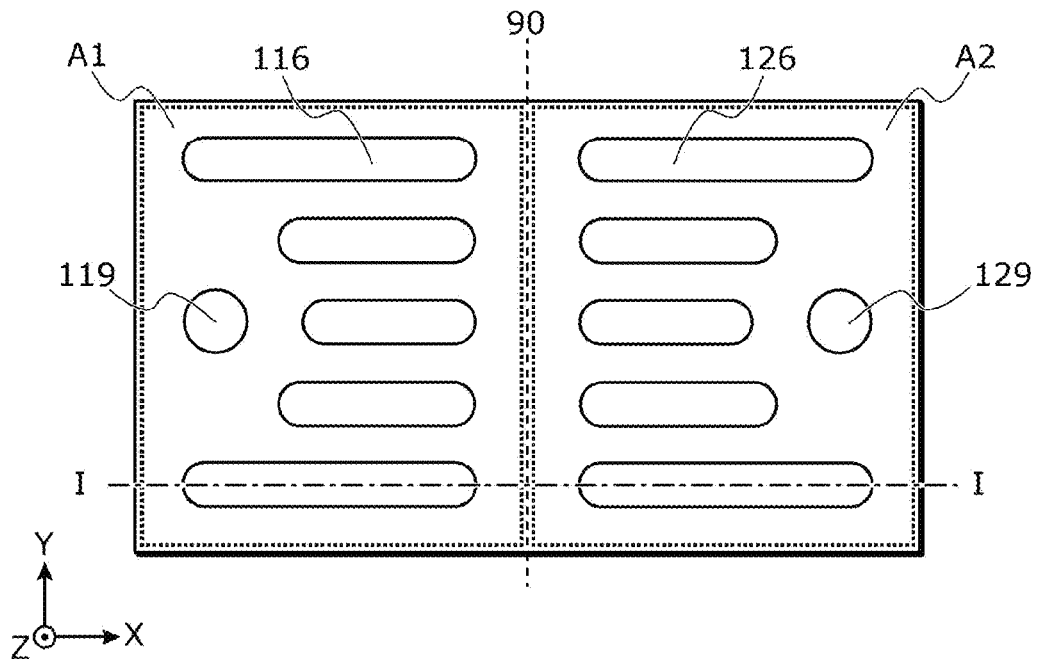
FIG. 2A is a schematic plan view showing the example of the structure of the semiconductor device according to Embodiment 1.
Figure 2B:
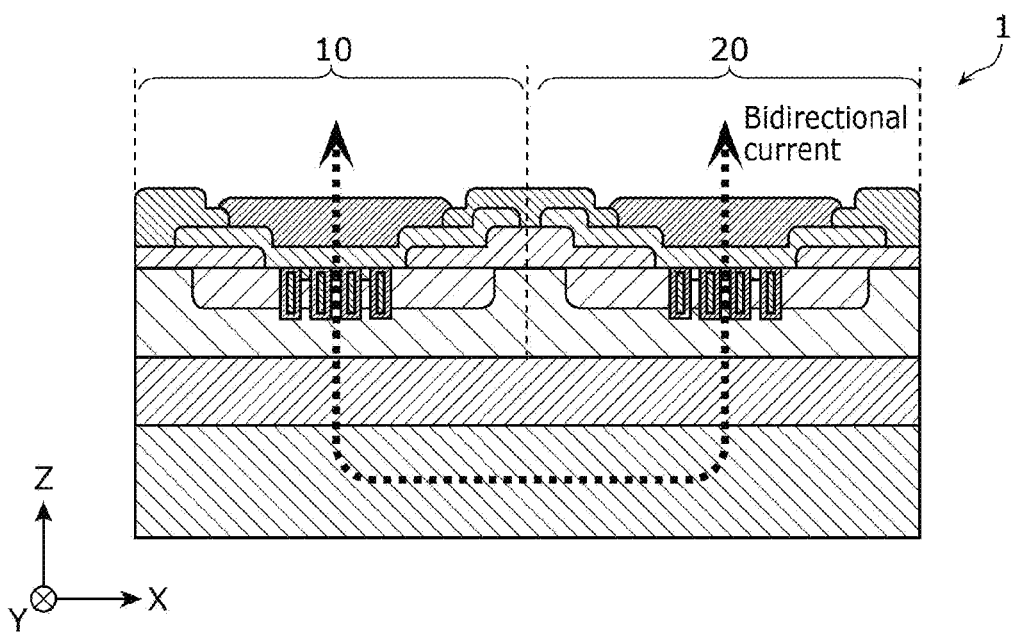
FIG. 2B is a schematic cross-sectional view showing a principal current flowing through the semiconductor device according to Embodiment 1.

FIG. 1 is a schematic cross-sectional view showing an example of a structure of a semiconductor device according to Embodiment 1. FIG. 2A is a plan view of the structure. The size and shape of the semiconductor device and the arrangement of electrode pads are an example. FIG. 2B is a cross-sectional view schematically showing a principal current flowing through the semiconductor device. FIG. 1 and FIG. 2B show a cross section taken along line I-I in FIG. 2A.

As shown in FIG. 1 and FIG. 2A, semiconductor device 1 includes: semiconductor layer 40; metal layer 30; first vertical field-effect transistor 10 (hereinafter also referred to as "transistor 10") provided in first region A1 in semiconductor layer 40; and second vertical field-effect transistor 20 (hereinafter also referred to as "transistor 20") provided in second region A2 in semiconductor layer 40. Here, as shown in FIG. 2A, first region A1 and second region A2 are adjacent to each other in a plan view of semiconductor layer 40. In FIG. 2A, a dashed line indicates virtual boundary line 90 between first region A1 and second region A2.

Semiconductor layer 40 is provided by stacking semiconductor substrate 32 and low-concentration impurity layer 33. Semiconductor substrate 32 is disposed on a rear surface side of semiconductor layer 40, and includes silicon of a first conductivity type containing impurities of the first conductivity type. Low-concentration impurity layer 33 is disposed on a front surface side of semiconductor layer 40, in contact with semiconductor substrate 32, is of the first conductivity type, and contains impurities of the first conductivity type having a concentration lower than a concentration of the impurities of the first conductivity type contained in semiconductor substrate 32.

Low-concentration impurity layer 33 may be provided on semiconductor substrate 32 by, for example, epitaxial growth. It should be noted that low-concentration impurity layer 33 is also a common drift layer of transistors 10 and 20, and may be referred to as a drift layer in the Description.

Metal layer 30 is provided in contact with the rear surface side of semiconductor layer 40 and includes silver (Ag) or copper (Cu). It should be noted that metal layer 30 may include a trace amount of a chemical element other than metal mixed in as impurities in a step of manufacturing a metal material. Moreover, metal layer 30 may be or may not be provided on the entire surface of semiconductor layer 40 on a rear surface side.

As shown in FIG. 1 and FIG. 2A, first body region 18 of a second conductivity type different from the first conductivity type containing impurities of the second conductivity type is provided in first region A1 of low-concentration impurity layer 33. First source region 14 of the first conductivity type containing impurities of the first conductivity type, first gate conductor 15, and first gate insulating film 16 are provided in first body region 18. First gate insulating film 16 is provided inside each of a plurality of first gate trenches 17 that penetrate through first source region 14 and first body region 18 from a top surface of semiconductor layer 40 to a depth that reaches a portion of low-concentration impurity layer 33. First gate conductor 15 is provided on first gate insulating film 16 inside each of the plurality of first gate trenches 17.

First source electrode 11 includes portion 12 and portion 13. Portion 12 is connected to first source region 14 and first body region 18 via portion 13. First gate conductor 15 is an embedded gate electrode embedded inside semiconductor layer 40, and is electrically connected to first gate electrode pad 119.

Portion 12 of first source electrode 11 may be a layer joined with solder at the time of reflow in facedown mounting, and comprise, as a non-limiting example, a metal material including at least one of nickel, titanium, tungsten, or palladium. The surface of portion 12 may be plated with gold etc.

Portion 13 of first source electrode 11 may be a layer that connects portion 12 and semiconductor layer 40, and comprise, as a non-limiting example, a metal material including at least one of aluminum, copper, gold, or silver.

Second body region 28 of the second conductivity type containing impurities of the second conductivity type is provided in second region A2 of low-concentration impurity layer 33. Second source region 24 of the first conductivity type containing impurities of the first conductivity type, second gate conductor 25, and second gate insulating film 26 are provided in second body region 28. Second gate insulating film 26 is provided inside each of a plurality of second gate trenches 27 that penetrate through second source region 24 and second body region 28 from the top surface of semiconductor layer 40 to a depth that reaches a portion of low-concentration impurity layer 33. Second gate conductor 25 is provided on second gate insulating film 26 inside each of the plurality of second gate trenches 27.

Second source electrode 21 includes portion 22 and portion 23. Portion 22 is connected to second source region 24 and second body region 28 via portion 23. Second gate conductor 25 is an embedded gate electrode embedded inside semiconductor layer 40, and is electrically connected to second gate electrode pad 129.

Portion 22 of second source electrode 21 may be a layer joined with solder at the time of reflow in facedown mounting, and comprise, as a non-limiting example, a metal material including at least one of nickel, titanium, tungsten, or palladium. The surface of portion 22 may be plated with gold etc.

Portion 23 of second source electrode 21 may be a layer that connects portion 22 and semiconductor layer 40, and comprise, as a non-limiting example, a metal material including at least one of aluminum, copper, gold, or silver.

The above-described configuration of transistors 10 and 20 allow semiconductor substrate 32 to serve as a common drain region having a first drain region of transistor 10 and a second drain region of transistor 20 in common. A portion of low-concentration impurity layer 33 on a side adjacent to semiconductor substrate 32 may sometimes serve as a common drain region. In addition, metal layer 30 serves as a common drain electrode having a drain electrode of transistor 10 and a drain electrode of transistor 20 in common.

As shown in FIG. 1, first body region 18 is covered with interlayer insulating layer 34 having an opening portion, and portion 13 of first source electrode 11 is connected to first source region 14 via the opening portion of interlayer insulating layer 34. Interlayer insulating layer 34 and portion 13 of first source electrode 11 are covered with passivation layer 35 having an opening portion, and portion 12 is connected to portion 13 of first source electrode 11 via the opening portion of passivation layer 35.

Second body region 28 is covered with interlayer insulating layer 34 having an opening portion, and portion 23 of second source electrode 21 is connected to second source region 24 via the opening portion of interlayer insulating layer 34. Interlayer insulating layer 34 and portion 23 of second source electrode 21 are covered with passivation layer 35 having an opening portion, and portion 22 is connected to portion 23 of second source electrode 21 via the opening portion of passivation layer 35.

Accordingly, a plurality of first source electrode pads 116 refer to a region in which first source electrode 11 is partially exposed to the surface of semiconductor device 1, that is, a terminal portion; and a plurality of second source electrode pads 126 refer to a region in which second source electrode 21 is partially exposed to the surface of semiconductor device 1, that is, a terminal portion. Similarly, one or more first gate electrode pads 119 refer to a region in which first gate electrode 19 (not shown in FIG. 1, FIG. 2A, FIG. 2B) is partially exposed to the surface of semiconductor device 1, that is, a terminal portion; and one or more second gate electrode pads 129 refer to a region in which second gate electrode 29 (not shown in FIG. 1, FIG. 2A, FIG. 2B) is partially exposed to the surface of semiconductor device 1, that is, a terminal portion.

In semiconductor device 1, for example, assuming that the first conductivity type is N-type and the second conductivity type is P-type, first source region 14, second source region 24, semiconductor substrate 32, and low-concentration impurity layer 33 may be N-type semiconductors, and first body region 18 and second body region 28 may be P-type semiconductors.

Moreover, in semiconductor device 1, for example, assuming that the first conductivity type is P-type and the second conductivity type is N-type, first source region 14, second source region 24, semiconductor substrate 32, and low-concentration impurity layer 33 may be P-type semiconductors, and first body region 18 and second body region 28 may be N-type semiconductors.

The following description illustrates a conductive operation of semiconductor device 1 when, assuming that the first conductivity type is N-type and the second conductivity is P-type, transistors 10 and 20 are what is called N-channel transistors.

It should be noted that the following description is on the premise that transistors 10 and 20 have symmetry, that is, are the same in function, characteristics, structure, etc. Although FIG. 1, FIG. 2A, and FIG. 2B are drawn on the premise of symmetry, symmetry is not always a necessary condition for a chip-size-package type vertical field-effect transistor including a dual configuration in the present disclosure.

[2. Operation of Vertical Field-Effect Transistor]

Figure 3A:
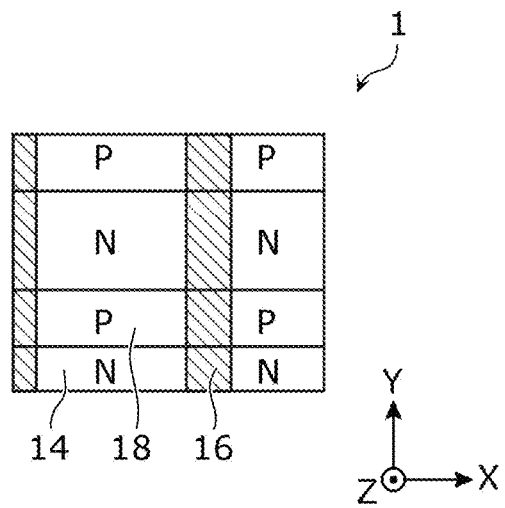
FIG. 3A is a schematic plan view of an approximate single unit configuration of a first transistor according to Embodiment 1.
Figure 3B:
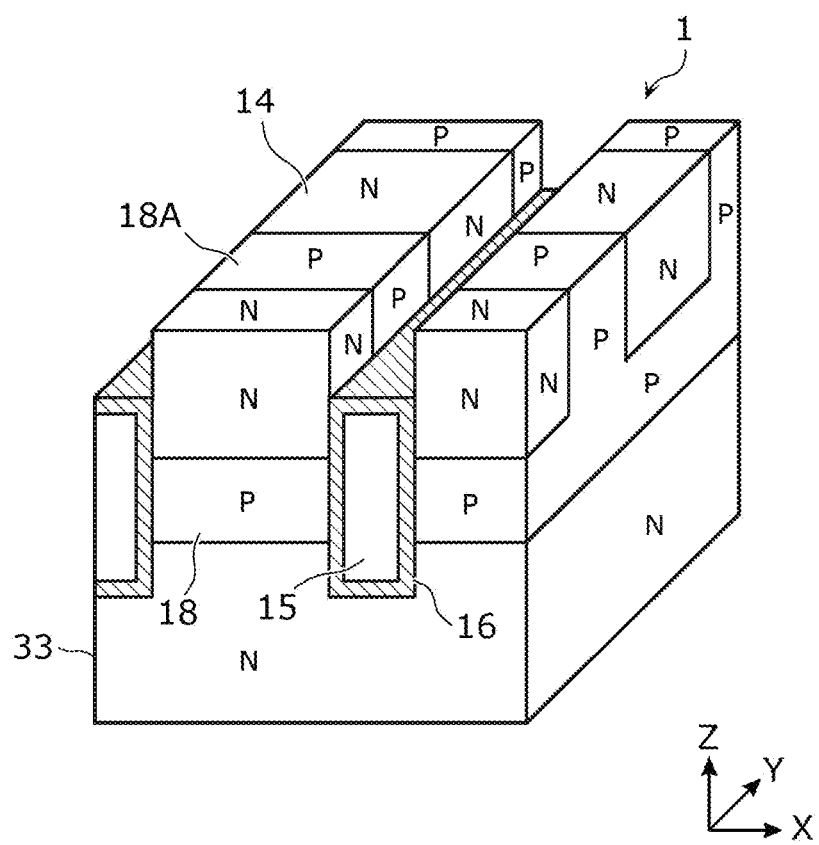
FIG. 3B is a schematic perspective view of the approximate single unit configuration of the first transistor according to Embodiment 1.

FIG. 3A and FIG. 3B are a plan view and a perspective view of an approximate single unit configuration of transistor 10 (or transistor 20) that is repeatedly formed in an X direction and a Y direction of semiconductor device 1, respectively. For the sake of clarity, neither FIG. 3A nor FIG. 3B illustrates semiconductor substrate 32 and first source electrode 11 (or second source electrode 21).

The Y direction is a direction that is parallel to the top surface of semiconductor layer 40 and in which first gate trench 17 and second gate trench 27 extend. The X direction is a direction that is parallel to the top surface of semiconductor layer 40 and orthogonal to the Y direction. A Z direction is a direction that is orthogonal to both the X direction and the Y direction and indicates a height direction of the semiconductor device. In the present disclosure, the Y direction, the X direction, and the Z direction may be referred to as a first direction, a second direction, and a third direction, respectively. As shown in FIG. 3A and FIG. 3B, transistor 10 includes first connector 18A that electrically connects first body region 18 and first source electrode 11. First connector 18A is a region of first body region 18 in which first source region 14 is not provided, and contains the same impurities of the second conductivity type as those of first body region 18. First source region 14 and first connector 18A are alternately and periodically disposed in the Y direction. The same applies to transistor 20.

In semiconductor device 1, when a high voltage and a low voltage are applied to first source electrode 11 and second source electrode 21, respectively, and a voltage higher than or equal to a threshold value is applied to second gate electrode 29 (second gate conductor 25) with respect to second source electrode 21, a conducting channel is formed in the vicinity of second gate insulating film 26 in second body region 28. As a result, a principal current flows in a pathway from first source electrode 11 to first connector 18A to first body region 18 to low-concentration impurity layer 33 to semiconductor substrate 32 to metal layer 30 to semiconductor substrate 32 to low-concentration impurity layer 33 to the conducting channel formed in second body region 28 to second source region 24 to second source electrode 21, and semiconductor device 1 becomes conductive. It should be noted that a PN junction is in an interface between second body region 28 and low-concentration impurity layer 33 in this conductive pathway and serves as a body diode. Moreover, since this principal current flows through metal layer 30, increasing the thickness of metal layer 30 makes it possible to increase the cross-sectional area of the principal current pathway and reduce an on-resistance of semiconductor device 1.

In semiconductor device 1, when a high voltage and a low voltage are applied to second source electrode 21 and first source electrode 11, respectively, and a voltage higher than or equal to a threshold value is applied to first gate electrode 19 (first gate conductor 15) with respect to first source electrode 11, a conducting channel is formed in the vicinity of first gate insulating film 16 in first body region 18. As a result, a principal current flows in a pathway from second source electrode 21 to second connector 28A to second body region 28 to low-concentration impurity layer 33 to semiconductor substrate 32 to metal layer 30 to semiconductor substrate 32 to low-concentration impurity layer 33 to the conducting channel formed in first body region 18 to first source region 14 to first source electrode 11, and semiconductor device 1 becomes conductive. It should be noted that a PN junction is in an interface between first body region 18 and low-concentration impurity layer 33 in this conductive pathway and serves as a body diode.

Figure 4:
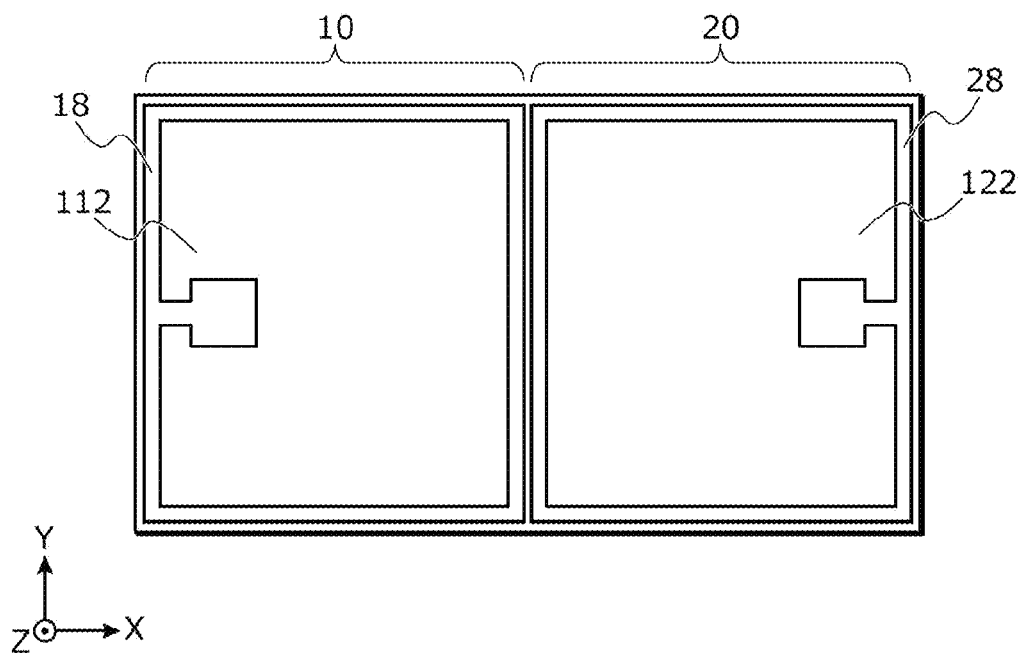
FIG. 4 is a schematic plan view showing an example of the structure of the semiconductor device according to Embodiment 1.

FIG. 4 is a plan view showing an example of shapes of, among the constituent elements of semiconductor device 1, first body region 18, second body region 28, first active region 112, and second active region 122 in a plan view of semiconductor layer 40 (low-concentration impurity layer 33). Though not shown in FIG. 4, both first gate trench 17 and second gate trench 27 extend in the Y direction.

First active region 112 refers to a minimum area that contains an entire portion in which a conducting channel is formed when a voltage higher than or equal to a threshold value is applied to first gate electrode 19 (first gate conductor 15) of transistor 10. The portion in which the conducting channel is formed is a portion in which each of the plurality of first gate trenches 17 is adjacent to first source region 14. First active region 112 is contained by first body region 18 in the plan view of semiconductor layer 40.

Second active region 122 refers to a minimum area that contains an entire portion in which a conducting channel is formed when a voltage higher than or equal to a threshold value is applied to second gate electrode 29 (second gate conductor 25) of transistor 20. The portion in which the conducting channel is formed is a portion in which each of the plurality of second gate trenches 27 is adjacent to second source region 24. Second active region 122 is contained by second body region 28 in the plan view of semiconductor layer 40.

A region surrounding first active region 112 of first region A1 is referred to as a first outer peripheral region, and a region surrounding second active region 122 of second region A2 is referred to as a second outer peripheral region.

It may be recognized that a vertical field-effect transistor including a single configuration is generally formed of only one side (transistor 10) of a vertical field-effect transistor including a dual configuration. For the chip-size-package type, however, a drain electrode pad may be further provided on the front surface side of semiconductor layer 40 including source electrode pad 116 and gate electrode pad 119. In this case, it is necessary to form, from the front surface side of semiconductor layer 40, a drain extraction structure electrically connected to semiconductor substrate 32 on a rear surface side of semiconductor layer 40.

[3. Depth of Gate Trench and Characteristics of Transistor]

(3-1. Drain Breakdown Voltage)

With regard to semiconductor device 1, unless otherwise noted, the following description illustrates only constituent elements of transistor 10. With regard to the reference signs, unless necessary, those assigned to the constituent elements of transistor 10 are used as representatives.

In semiconductor device 1, an electric potential difference between first source electrode 11 and second source electrode 21 is referred to as a source-to-source voltage (VSS [V]). In the product specification of semiconductor device 1, a source-to-source maximum voltage in specification (BVSSS[V]) is set depending on the intended use. A sourceto-source maximum voltage in specification (BVSSS[V]) may be simply referred to as a breakdown voltage or a drain breakdown voltage in the present disclosure. Alternatively, the source-to-source maximum voltage in specification (BVSSS[V]) may be referred to as a rated voltage.

A border between first body region 18 and low-concentration impurity layer 33 includes a PN junction, and depletion layers are provided with the PN junction interposed therebetween. To increase a drain breakdown voltage, a structure that allows depletion layers to expand sufficiently when transistor 10 is off is required, and it is necessary to design a carrier concentration (resistivity) or thickness of low-concentration impurity layer 33 appropriately.

In order for the depletion layers to expand sufficiently, it is necessary to decrease the carrier concentration (increase the resistivity) of low-concentration impurity layer 33, and increase the thickness of low-concentration impurity layer 33. Since it is possible to increase the thickness of low-concentration impurity layer 33 relatively as viewed from a tip of first gate trench 17, first gate trench 17 may be shallow for the purpose of improving a drain breakdown voltage.

Although the description of the present embodiment includes illustration of VSS and BVSSS because the description is based on the vertical field-effect transistor including the dual configuration, a drain-to-source voltage (VDS[V]) and a drain-to-source maximum voltage in specification (BVDSS[V]) may be used in a case of the vertical field-effect transistor including the signal configuration.

Subsequently, even for the vertical field-effect transistor including the dual configuration, source-to-source is referred to as drain-to-source for descriptive purposes, and VDS and BVDSS are used in the description.

(3-2. On Resistance)

First gate trench 17 is in contact with first source region 14 and penetrates through first body region 18 from a top surface of semiconductor layer 40 to a depth that reaches a portion of low-concentration impurity layer 33. A current flowing from first source electrode 11 toward semiconductor substrate 32 that is a common drain flows through low-concentration impurity layer 33 along first gate trench 17 up to the tip of first gate trench 17 after flowing through first body region 18.

Even in low-concentration impurity layer 33, the current flowing along the tip of first gate trench 17 flows with conduction resistance comparatively reduced under the influence of a voltage applied to first gate conductor 15. However, after passing the tip of first gate trench 17, the current flows against resistance according to a resistivity in low-concentration impurity layer 33.

For this reason, when first gate trench 17 is relatively shallow, the current flows over a relatively long distance inside low-concentration impurity layer 33 up to semiconductor substrate 32. Conversely, when first gate trench 17 is relatively deep, the current flows over a relatively short distance inside low-concentration impurity layer 33 up to semiconductor substrate 32. Accordingly, first gate trench 17 may be deep for the purpose of reducing the resistance of the current flowing through low-concentration impurity layer 33.

(3-3. Electric Field Strength and Reliability)

Increasing VDS in semiconductor device 1 causes a change in a distribution of electric potentials in low-concentration impurity layer 33. Since first gate trench 17 is a trench having a tip located at a depth that reaches a portion of low-concentration impurity layer 33, the distribution of the electric potentials in low-concentration impurity layer 33 changes according to the width, distance, or depth of first gate trench 17.

Figure 5A:
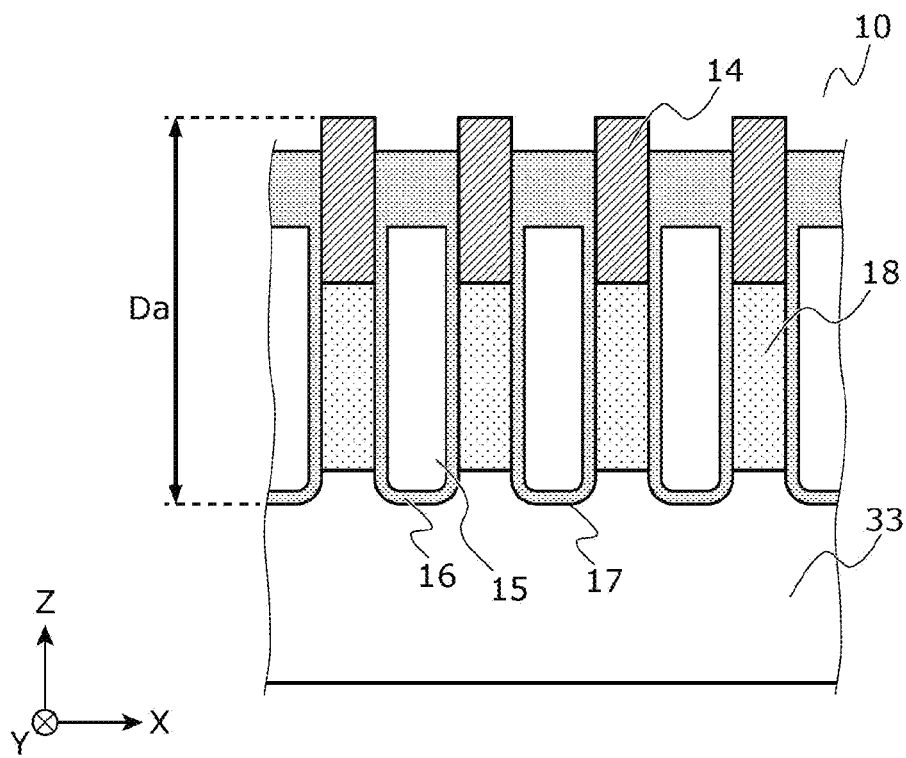
FIG. 5A is a schematic cross-sectional view showing an example of a structure of a first transistor according to Comparative Example 1 in Embodiment 1.
Figure 5B:
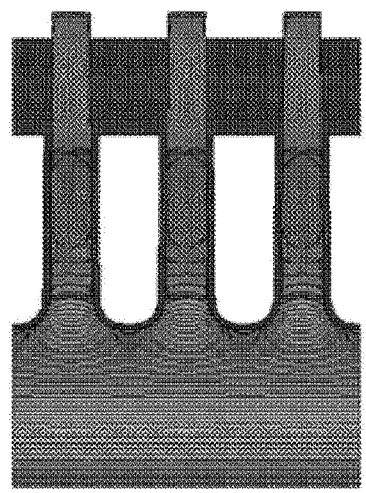
FIG. 5B is a schematic cross-sectional diagram obtained by simulating a distribution of electric potentials occurring when a rated voltage is applied between a drain and a source in a structure of a semiconductor device shown in FIG. 5A.
Figure 5B:
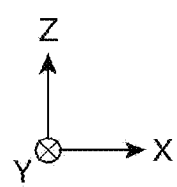

FIG. 5A shows a structure in which all first gate trenches 17 are uniformly provided at depth Da [nm], which is Comparative Example 1 in Embodiment 1. FIG. 5B shows a result of simulating a distribution of electric potentials [V] in FIG. 5A when a voltage is applied until VDS=BVDSS (here 22 V) is achieved while an applied voltage to first gate conductor 15 remains at zero.

Figure 6A:
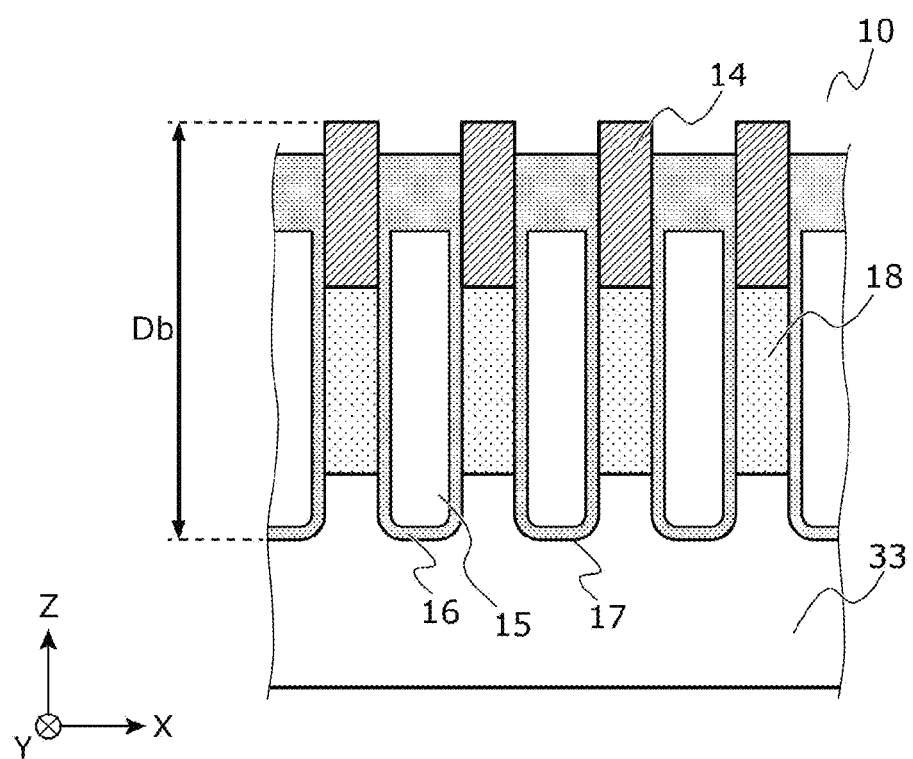
FIG. 6A is a schematic cross-sectional view showing an example of a structure of a first transistor according to Comparative Example 2 in Embodiment 1.
Figure 6B:
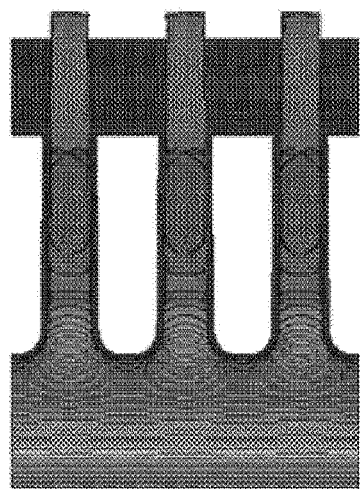
FIG. 6B is a schematic cross-sectional diagram obtained by simulating a distribution of electric potentials occurring when a rated voltage is applied between a drain and a source in a structure of a semiconductor device shown in FIG. 6A.

FIG. 6A shows a structure in which all first gate trenches 17 are uniformly provided at depth Db [nm] (Da<Db), which is Comparative Example 2 in Embodiment 1. FIG. 6B shows a result of simulating a distribution of electric potentials [V] in FIG. 6A when a voltage is applied until VDS=BVDSS (here 22 V) is achieved while an applied voltage to first gate conductor 15 remains at zero.

In Comparative Example 1 (FIG. 5A, FIG. 5B) and Comparative Example 2 (FIG. 6A, FIG. 6B), only the depth of first gate trench 17 is changed, and the position of the PN junction remains the same.

Comparative Example 1 (FIG. 5A, FIG. 5B) shows a result when first gate trenches 17 are uniformly and relatively shallow, compared to Comparative Example 2 (FIG. 6A, FIG. 6B). Conversely, Comparative Example 2 (FIG. 6A, FIG. 6B) shows a result when first gate trenches 17 are uniformly and relatively deep, compared to Comparative Example 1 (FIG. 5A, FIG. 5B). A difference in depth between first gate trench 17 shown in Comparative Example 1 (FIG. 5A, FIG. 5B) and first gate trench 17 shown in Comparative Example 2 (FIG. 6A, FIG. 6B) is 100 nm.

In FIG. 5B, since low-concentration impurity layer 33 is relatively thick when viewed from the tip of first gate trench 17, compared to FIG. 6B, electric potentials of VDS=BVDSS are distributed in the thick width, and distances between equipotential lines in the proximity of the tip of first gate trench 17 increase. This means that electric field strength in low-concentration impurity layer 33 is relatively low.

In contrast, in FIG. 6B, since low-concentration impurity layer 33 is relatively thin when viewed from the tip of first gate trench 17, compared to FIG. 5B, electric potentials of VDS=BVDSS are distributed in the thin width, and distances between equipotential lines in the proximity of the tip of first gate trench 17 decrease. This means that electric field strength in low-concentration impurity layer 33 is relatively high.

Figure 5C:
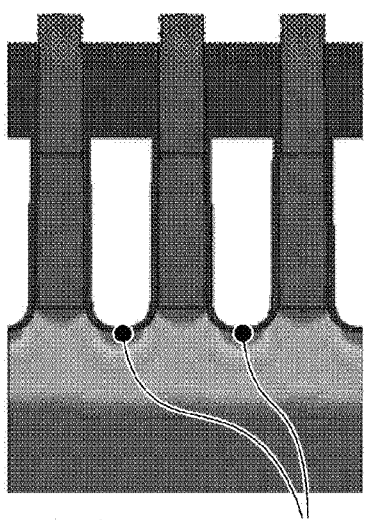
FIG. 5C is a schematic cross-sectional diagram obtained by simulating electric field strength occurring when a rated voltage is applied between the drain and the source in the structure of the semiconductor device shown in FIG. 5A.
Figure 5C:
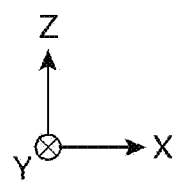
Figure 6C:
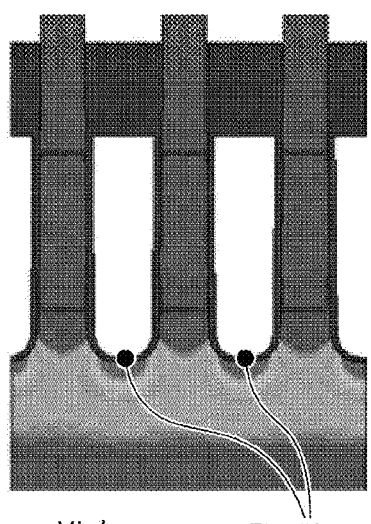
FIG. 6C is a schematic cross-sectional diagram obtained by simulating a distribution of electric field strength occurring when a rated voltage is applied between the drain and the source in the structure of the semiconductor device shown in FIG. 6A.

FIG. 5C and FIG. 6C are each obtained by shading a result of simulating a distribution of electric field strength [V/cm] when a distribution of electric potentials becomes that of a corresponding one of FIG. 5B and FIG. 6B. According to FIG. 5C and FIG. 6C, a central portion of the tip of first gate trench 17 has the highest electric field strength structurally, and a difference in electric field strength at this position between Comparative Example 1 (FIG. 5C) and Comparative Example 2 (FIG. 6C) is 0.02 MV/cm.

When electric field strength in the vicinity of first gate trench 17 reaches at least a certain level, carriers are accumulated in the proximity of first gate insulating film 16 and become what is called hot electrons. In the case where the hot electrons are generated, since an inversion layer is generated and a conducting channel is formed even when a gate voltage is not applied to first gate conductor 15, the reliability of transistor 10 decreases.

According to FIG. 5C and FIG. 6C, since the electric field strength increases with increase in depth of first gate trench 17, first gate trench 17 may be shallow from a standpoint of preventing the reliability from decreasing.

[4. Mix of Shallow Gate Trenches and Deep Gate Trenches]

As stated above, the characteristics of transistor 10 and the depth of first gate trench 17 are closely related. Such a relation is in trade-off depending on the characteristics, it is difficult to improve all the characteristics, and it is necessary to design the depth of first gate trench 17 appropriately depending on the primary intended use.

As a result of repeated study, the inventors have discovered that it is possible to improve the characteristics of transistor 10 by causing a plurality of first gate trenches 17 to comprise a mix of first gate trenches 17 whose depths have been changed, compared to a case in which the depth of all first gate trenches 17 is uniform as with Comparative Example 1 and Comparative Example 2. The following describes an impact of a mix of first gate trenches 17 having different depths from the top surface of semiconductor layer 40 on the characteristics of transistor 10.

The expression "first gate trenches 17 having different depths" stated in the present disclosure does not refer to unavoidable manufacturing variations but to a difference by design that is intentionally caused to appear by providing a target value.

First, as an example, a case in which a plurality of first gate trenches 17 comprise a mix of first gate trench 17 having depth Da [nm] and first gate trench 17 having depth Db [nm] (Da<Db) is described with reference to FIG. 7A. For descriptive purposes, subsequently, regardless of first gate trench 17 or second gate trench 27, any gate trench having depth Da is referred to as third gate trench 171, and any gate trench having depth Db is referred to as fourth gate trench 172. Third gate trench 171 is a relatively shallow gate trench, and fourth gate trench 172 is a relatively deep gate trench.

A gate conductor and a gate insulating film included in third gate trench 171 are referred to as third gate conductor 151 and third gate insulating film 161, respectively. A gate conductor and a gate insulating film included in fourth gate trench 172 are referred to as fourth gate conductor 152 and fourth gate insulating film 162, respectively.

Figure 7A:
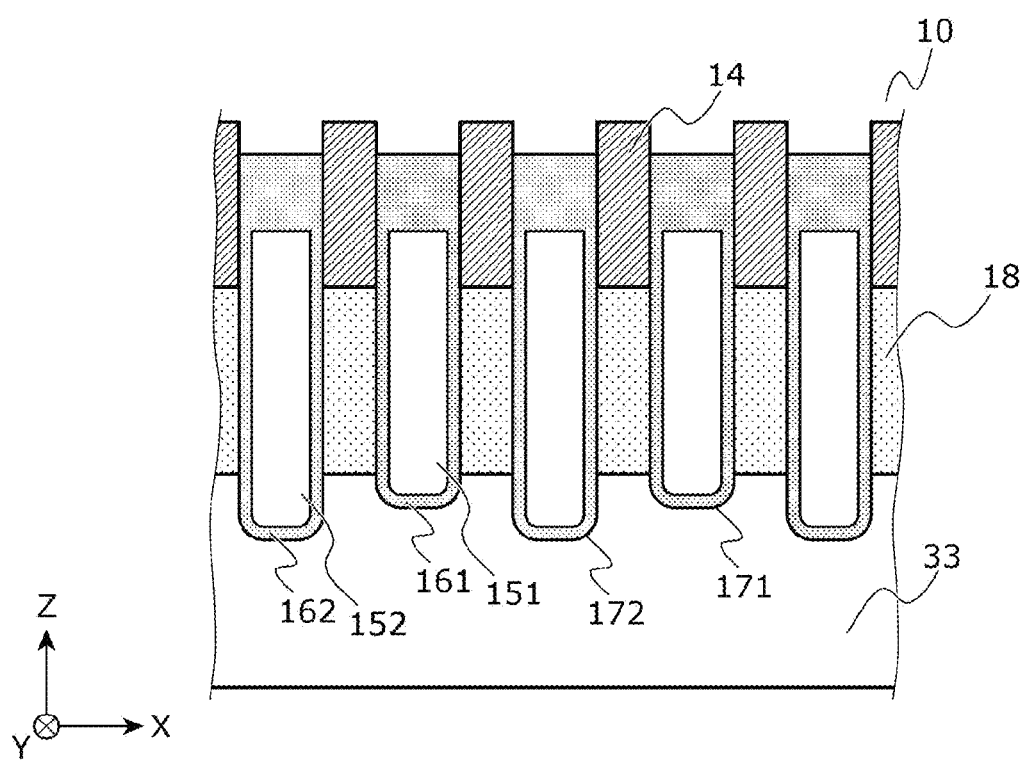
FIG. 7A is a schematic cross-sectional view showing an example of the structure of the first transistor according to Embodiment 1.

FIG. 7A is a schematic diagram when a portion of transistor 10 is cross-sectionally viewed along an X-Z plane, and constituent elements including interlayer insulating layer 34 and above such as first source electrode 11 and constituent elements including semiconductor substrate 32 and below are omitted from the figure. In a structure shown in FIG. 7A, third gate trench 171 and fourth gate trench 172 have the same width and are disposed alternately at regular distances.

Figure 7B:
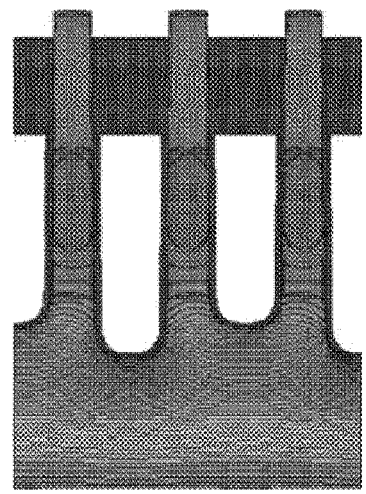
FIG. 7B is a schematic cross-sectional diagram obtained by simulating a distribution of electric potentials occurring when a rated voltage is applied between a drain and a source in a structure of a semiconductor device shown in FIG. 7A.
Figure 7B:
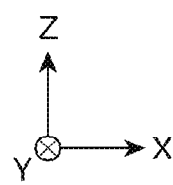
Figure 7C:
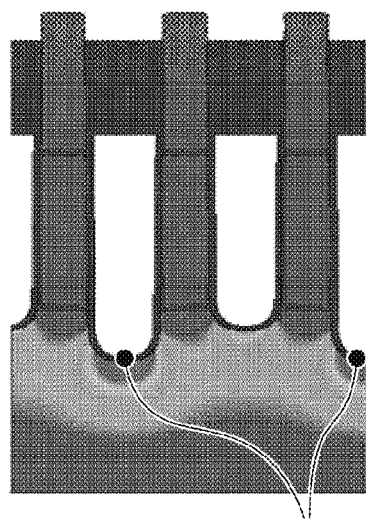
FIG. 7C is a schematic cross-sectional diagram obtained by simulating electric field strength occurring when a rated voltage is applied between the drain and the source in the structure of the semiconductor device shown in FIG. 7A.
Figure 7C:
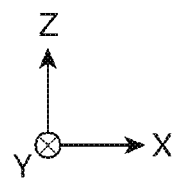

FIG. 7B shows a result of simulating a distribution of electric potentials [V] in FIG. 7A when a voltage is applied until VDS=BVDSS (here 22 V) is achieved in a state in which an applied voltage to third gate conductor 151 and fourth gate conductor 152 remains at zero. FIG. 7C is obtained by shading a result of simulating a distribution of electric field strength [V/cm] when a distribution of electric potentials becomes that of FIG. 7B.

As is clear from FIG. 7B, electric potentials in drift layer 33 are collectively pushed downward because of fourth gate trench 172, and distances between equipotential lines in the proximity of third gate trench 171 relatively increase. As a result, electric field strength in a central portion of a tip of third gate trench 171 decreases.

Although depth Da of third gate trench 171 in FIG. 7A is the same as depth Da of first gate trench 17 in FIG. 5A (Comparative Example 1), a comparison with FIG. 5A in which all first gate trenches 17 are uniform in depth clearly shows that the electric field strength in the central portion of the tip of third gate trench 171 decreases. The reasons why the electric field strength in the central portion of the tip of third gate trench 171 decreases in spite of same depth Da are that fourth gate trench 172 pushes down the electric potentials toward low-concentration impurity layer 33 and that fourth gate trench 172 deeper than third gate trench 171 is located in the proximity of third gate trench 171. In other words, a conventional structure in which all first gate trenches 17 are uniform in depth does not achieve this effect.

On the other hand, electric field strength in a central portion of a tip of fourth gate trench 172 increases. Although a depth of first gate trench 17 in FIG. 6A (Comparative Example 2) is the same as depth Db of fourth gate trench 172 in FIG. 7A, all first gate trenches 17 are uniform in depth in FIG. 6A. A comparison between corresponding FIG. 6C and FIG. 7C clearly shows that the electric field strength in the central portion of the tip of fourth gate trench 172 in FIG. 7C is higher than electric field strength in the central portion of the tip of first gate trench 17 in FIG. 6C.

This is because when only some of fourth gate trenches 172 push down electric potentials as shown in FIG. 7B, these fourth gate trenches 172 change electric potentials only in the vicinity of themselves locally and sharply, whereas when all first gate trenches 17 are uniform in depth, all first gate trenches 17 change electric potentials uniformly.

An increase in the electric field strength at the tip of first gate trench 17 raises a likelihood of generating hot electrons in the vicinity of first gate insulating film 16 and decreases reliability. For this reason, such an increase is undesirable. In FIG. 7C that shows one embodiment of the present disclosure, however, the number of fourth gate trenches 172 of which electric field strength in central portions of respective tips increases is reduced (reduced by approximately half), compared to FIG. 6C. To put it another way, tolerance to a decrease in reliability is structurally improved, and a structure that does not immediately make an impact on the decrease in reliability even when higher electric field strength than conventional electric field strength is generated is achieved.

Unlike the conventional structure, the essence of achieving the advantageous effects of the present disclosure lies in causing all first gate trenches 17 not to be uniform in depth, and in disposing relatively deep fourth gate trenches 172 in appropriate number, at an appropriate distance, and at appropriate intervals with respect to relatively shallow third gate trenches 171. Such a structure makes it possible to increase the upper limit of electric field strength that leads to a decrease in reliability and improve the tolerance, while decreasing the electric field strength in the central portions of the respective tips of third gate trenches 171.

The performing example in which third gate trench 171 and fourth gate trench 172 are alternately disposed is described above. Fourth gate trenches 172 may be arranged on both sides of third gate trench 171 to sandwich third gate trench 171 in the X direction in order to decrease the electric field strength in the central portion of the tip of third gate trench 171. The most effective arrangement is a structure in which third gate trench 171 and fourth gate trench 172 are alternately disposed in the X direction.

Figure 8:
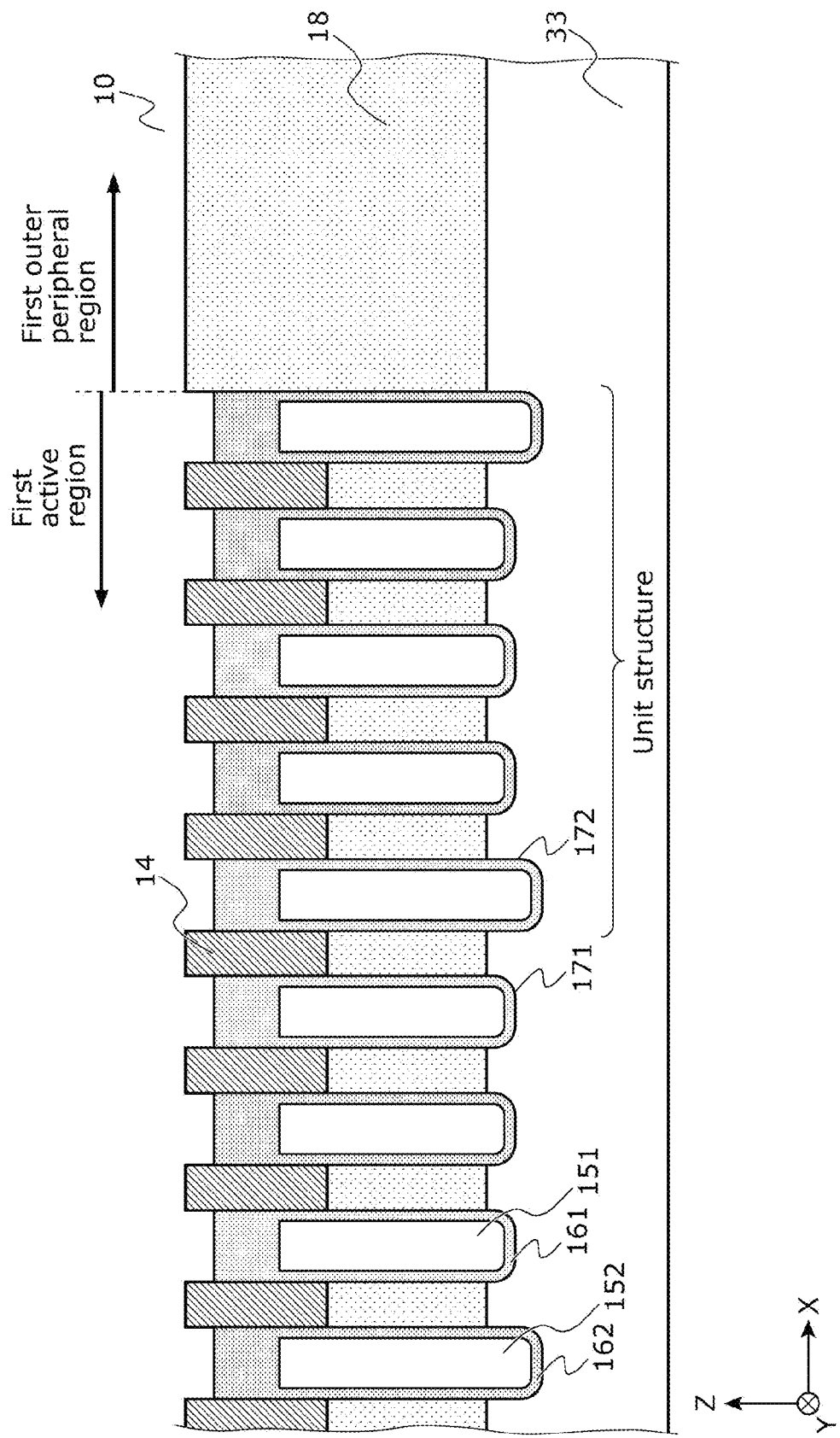
FIG. 8 is a schematic cross-sectional view showing an example of the structure of the first transistor according to Embodiment 1.

An arrangement that achieves the advantageous effects of the present disclosure is not limited to this example. The number of third gate trenches 171 interposed between a pair of nearest fourth gate trenches 172 in the X direction may be plural. FIG. 8 shows one example. When the number of third gate trenches 171 disposed in transistor 10 is denoted by n (n is an integer greater than or equal to 1), the number of fourth gate trenches 172 disposed in transistor 10 may be at least 2 and at most (n+1).

Out of first gate trenches 17 disposed in first active region 112 of transistor 10, first gate trenches 17 at both farthest ends in the X direction may be fourth gate trenches 172, and remaining first gate trenches 17 may be third gate trenches 171. Such an arrangement makes it possible to decrease electric field strength in central portions of respective tips of third gate trenches 171 included in first active region 112.

Moreover, structures in which first gate trenches 17 disposed in first active region 112 of transistor 10 comprise at least one third gate trench 171 interposed between a pair of nearest fourth gate trenches 172 in the X direction may be disposed as unit structures at regular intervals in the X direction, and fourth gate trenches 172 disposed at the farthest ends of unit structures may be shared by adjacent unit structures.

In other words, first gate trenches 17 disposed in first active region 112 of transistor 10 may comprise fourth gate trenches 172 disposed at a constant distance from each other at regular intervals in a row of third gate trenches 171 in the X direction. Such arrangement of third gate trenches 171 and fourth gate trenches 172 makes it possible to decrease electric field strength in central portions of respective tips of third gate trenches 171 included in first active region 112.

In particular, when first gate trenches 17 comprise n third gate trenches 171 and n+1 fourth gate trenches 172, it is possible to dispose third gate trench 171 and fourth gate trench 172 alternately with, out of first gate trenches 17 disposed in transistor 10 (first active region 112), first gate trenches 17 at both farthest ends in the X direction being fourth gate trenches 172. This is desirable because it is possible to decrease electric field strength in central portions of respective tips of all third gate trenches 171 in this state.

Distance Laa [μm] between third gate trenches 171 may be constant. Moreover, distance Lbb [μm] between fourth gate trenches 172 may be constant.

Furthermore, when third gate trench 171 and fourth gate trench 172 are alternately disposed, Laa=Lbb may be satisfied, and with regard to distance Lab [μm] between third gate trench 171 and fourth gate trench 172, Lab=Laa/2=Lbb/2 may be satisfied. In this case, since it is possible to arrange both third gate trench 171 and fourth gate trench 172 as conducting channels at the same density, this is effective to reduce on resistance.

It should be noted that the following is a reiteration that any gate trench (one of first trench 17 or second gate trench 27, or one of third gate trench 171 or fourth gate trench 172) stated in the present disclosure contributes to the formation of a conducting channel, and contains a gate conductor (one of first gate conductor 15 or second gate conductor 25, or one of third gate conductor 151 or fourth gate conductor 152).

Third gate conductor 151 and fourth gate conductor 152 have the same electric potential when transistor 10 is driven, and a voltage applied to first gate electrode 19 is also equally applied to both third gate conductor 151 and fourth gate conductor 152.

A portion surrounding first active region 112 and included in the first outer peripheral region of semiconductor device 1 is excluded even when the portion is a trench in shape. Additionally, a portion that does not contribute to the formation of a conducting channel is also excluded even when the portion is included in first active region 112. Accordingly, each of first gate trenches 17 (third gate trenches 171 and fourth gate trenches 172) stated in the present disclosure includes a portion in contact with first source region 14 in an upper part and a portion in contact with first body region 18 in a lower part.

The following describes a relation between difference Δ (=Db−Da) [nm] between depth Da of third gate trench 171 and depth Db of fourth gate trench 172 in transistor 10, drain breakdown voltage VDS of transistor 10, and on resistance of transistor 10.

Table 1 shows results of simulating a relation between Δ (=Db−Da) [nm] and drain breakdown voltage VDS in transistor 10. In the simulations, third gate trench 171 and fourth gate trench 172 that are the same in internal width are alternately disposed, and Lab=Laa/2=Lbb/2=0.40 μm is set. In addition, depth Da=1040 nm of third gate trench 171 is kept uniform for all Levels 1 to 8.

TABLE 1

| Level | Depth [nm] Upper stand: Third gate trench Lower stand: Fourth gate trench | Difference Δ | Condition A Breakdown voltage [V] | Condition B Breakdown voltage [V] |
|---|---|---|---|---|
| 1 (FIG. 5) | 1040 1040 | 0 | 26.5 | — |
| 2 (FIG. 7) | 1040 1140 | 100 | 24.5 | — |
| 3 | 1040 1160 | 120 | 24.1 | 24.4 |
| 4 | 1040 1180 | 140 | 23.8 | 24.2 |
| 5 | 1040 1200 | 160 | 23.5 | 24.1 |
| 6 | 1040 1300 | 260 | 23.3 | 25.2 |
| 7 | 1040 1400 | 360 | 22.0 | 25.6 |
| 8 | 1040 1500 | 460 | 20.5 | — |

The breakdown voltages shown in Table 1 are calculated under two types of conditions. The two types are: condition A in which the resistivity and thickness of low-concentration impurity layer 33 are kept uniform without changing for each level; and condition B in which the thickness of low-concentration impurity layer 33 is increased with an increase in depth Db of fourth gate trench 172 with reference to a shape at Level 2. It should be noted that Level 1 corresponds to FIG. 5A, FIG. 5B, and FIG. 5C, and Level 2 corresponds to FIG. 7A, FIG. 7B, and FIG. 7C. Moreover, simulations under condition B are performed only for Levels 3 to 7.

Figure 9:
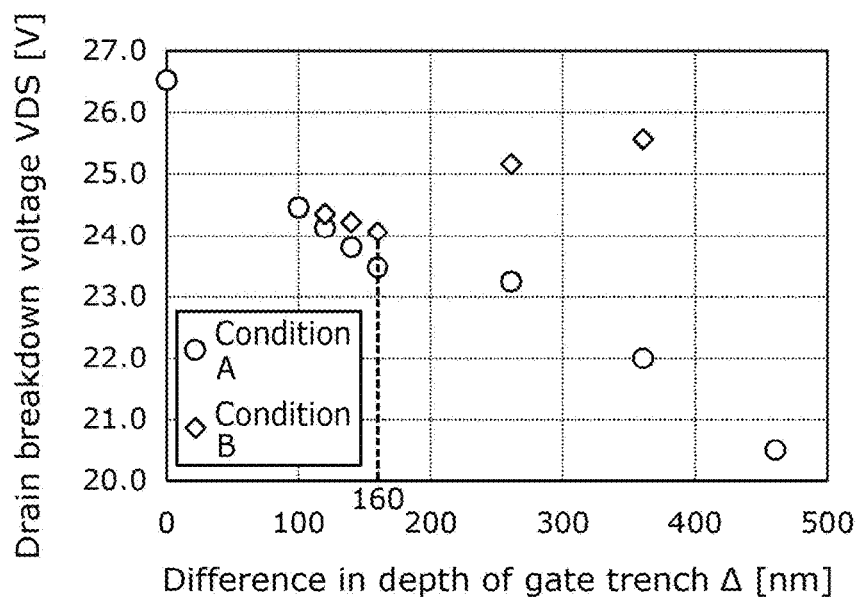
FIG. 9 is a graph obtained by plotting a relation between difference Δ in depth of gate trench and drain breakdown voltage VDS in the first transistor according to Embodiment 1.

FIG. 9 is obtained by simultaneously plotting the results of Table 1 under condition A (O) and condition B (◇). According to FIG. 9, under condition A (O), it is observed that while VDS decreases with an increase in Δ, the rate of decrease in VDS temporarily becomes slow in the proximity of Δ=160 nm. Additionally, under condition B (◇), it is observed that VDS increases with an increase in Δ with Δ=160 nm being a starting point.

Note that the tendency of a breakdown voltage changes beyond Δ=160 nm. In particular, it is noteworthy that under condition B (◇), VDS increases without decreasing or converging in a range in which Δ≥160 nm is satisfied.

Figure 10A:
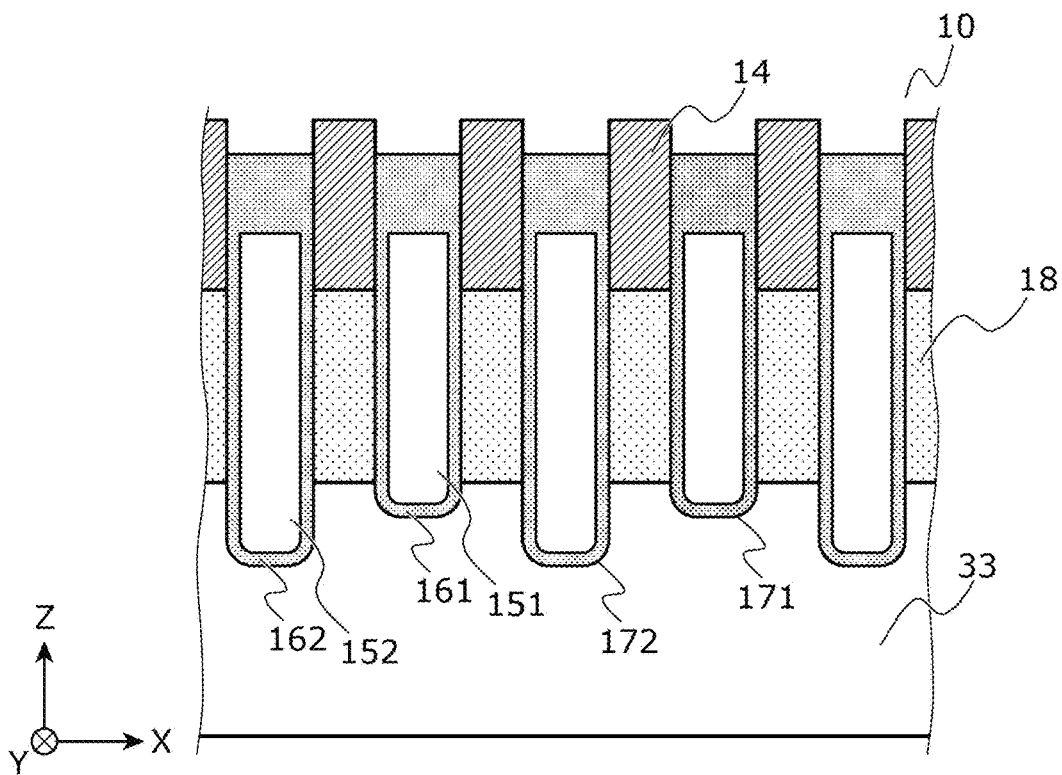
FIG. 10A is a schematic cross-sectional view showing an example of the structure of the first transistor according to Embodiment 1.
Figure 10B:
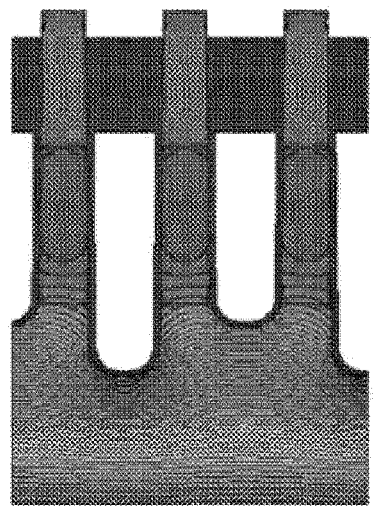
FIG. 10B is a schematic cross-sectional diagram obtained by simulating a distribution of electric potentials occurring when a rated voltage is applied between a drain and a source in a structure of a semiconductor device shown in FIG. 10A.
Figure 10B:
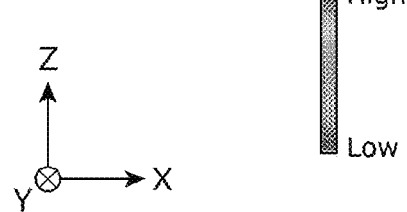
Figure 10C:
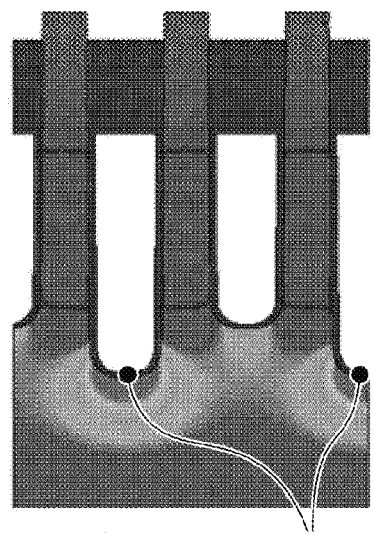
FIG. 10C is a schematic cross-sectional diagram obtained by simulating electric field strength occurring when a rated voltage is applied between the drain and the source in the structure of the semiconductor device shown in FIG. 10A.
Figure 10C:
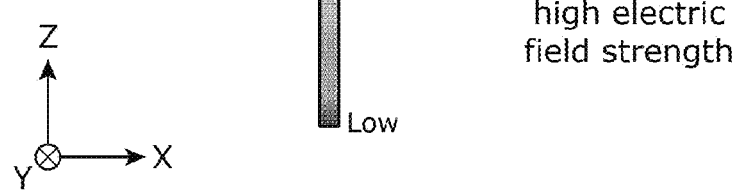
Figure 11A:
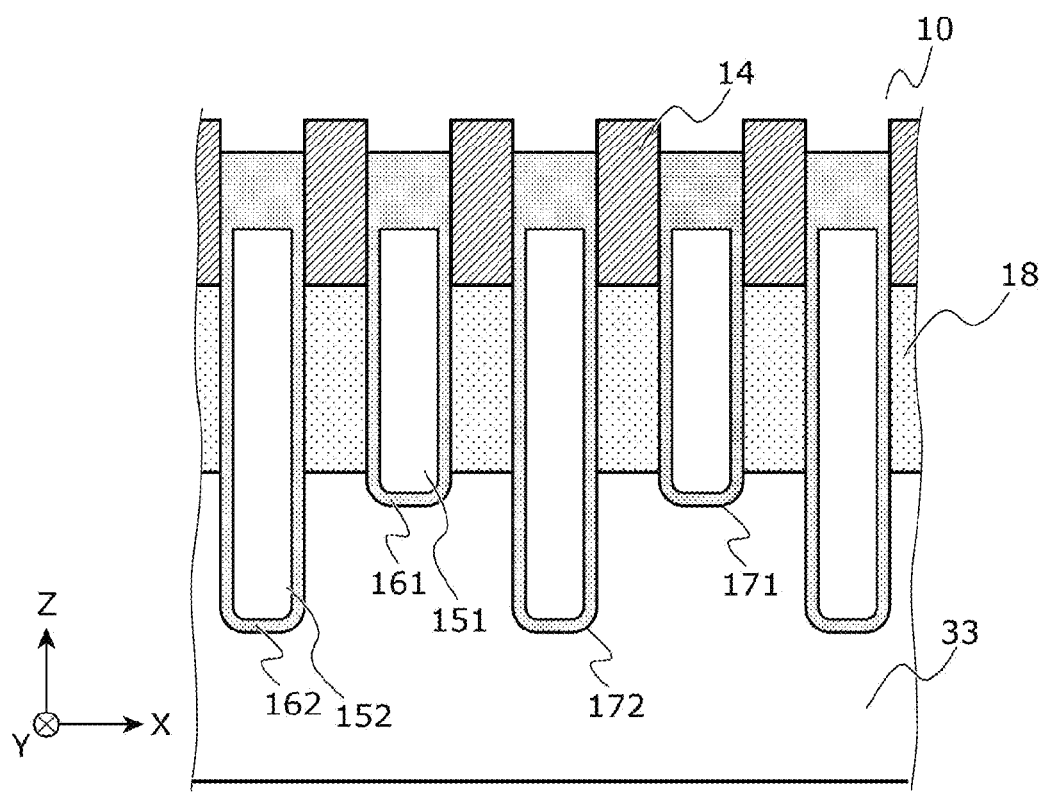
FIG. 11A is a schematic cross-sectional view showing an example of the structure of the first transistor according to Embodiment 1.
Figure 11B:
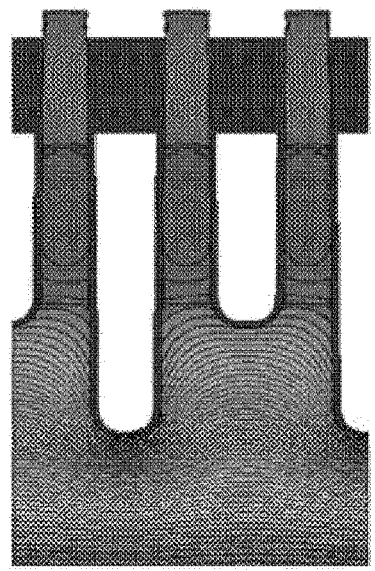
FIG. 11B is a schematic cross-sectional diagram obtained by simulating a distribution of electric potentials occurring when a rated voltage is applied between a drain and a source in a structure of a semiconductor device shown in FIG. 11A.
Figure 11B:
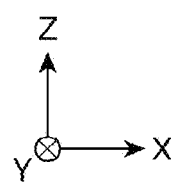
Figure 11B:
Figure 11C:
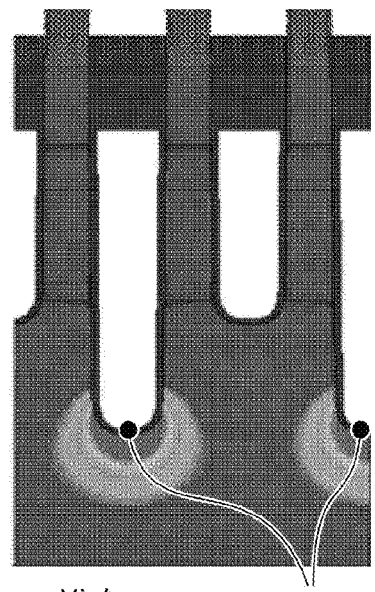
FIG. 11C is a schematic cross-sectional diagram obtained by simulating electric field strength occurring when a rated voltage is applied between the drain and the source in the structure of the semiconductor device shown in FIG. 11A.
Figure 11C:
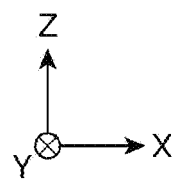
Figure 11C:
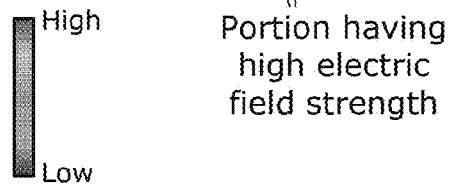

FIG. 10B and FIG. 10C each show a result of simulating a state of a distribution of electric potentials [V] and electric field strength [V/cm] when Db=1200 nm (Δ=160 nm) shown by Level 5 in Table 1. Moreover, FIG. 11B and FIG. 11C each show a result of simulating a state of a distribution of electric potentials [V] and electric field strength [V/cm] when Db=1400 nm (Δ=360 nm) shown by Level 7 in Table 1. FIG. 10B and FIG. 10C each show a simulation result when a voltage is applied to the structure shown in FIG. 10A until VDS=BVDSS (here 22 V) is achieved in a state in which an applied voltage to third gate conductor 151 and fourth gate conductor 152 remains at zero. Furthermore, FIG. 11B and FIG. 11C each show a simulation result when a voltage is applied to the structure shown in FIG. 11A until VDS=BVDSS (here 22 V) is achieved in a state in which an applied voltage to third gate conductor 151 and fourth gate conductor 152 remains at zero. It should be noted that FIG. 7B and FIG. 7C each show a simulation result when Db=1140 nm (Δ=100 nm).

Comparisons between FIG. 7B, FIG. 10B, and FIG. 11B and FIG. 7C, FIG. 10C, and FIG. 11C, respectively, clearly show that the electric field strength in the central portion of the tip of third gate trench 171 decreases with an increase in depth of fourth gate trench 172 and converges just in the proximity of Δ=160 nm (FIG. 10C). This is because fourth gate trenches 172 included on both sides of third gate trench 171 cause a distribution of electric potentials that increases the electric field strength at the central portion of the tip of third gate trench 171 to disappear by pushing down the electric potentials from the tip of third gate trench 171 to 160 nm.

For this reason, the electric field strength in the central portion of the tip of relatively shallow third gate trench 171 reaching a state in which the electric field strength does not decrease remarkably any longer can be said to be a factor for the noteworthy phenomenon appearing in FIG. 9. Such a phenomenon is an effect that a conventional structure in which all first gate trenches 17 are provided at the same depth is not capable of achieving.

Accordingly, when third gate trench 171 and fourth gate trench 172 are alternately disposed at equal distances, Δ may be adjusted to Δ≥160 nm. In other words, a difference between the depth of third gate trench 171 and the depth of fourth gate trench 172 may be at least 160 nm. When Δ≥160 nm is satisfied, adjusting the thickness of low-concentration impurity layer 33 makes it possible to improve a breakdown voltage as shown in Table 1 or FIG. 9. Moreover, when the necessity to improve a margin of the breakdown voltage is low, it is also possible to convert the amount of improvement in breakdown voltage into the reduction of on resistance by adjusting the resistivity or thickness of low-concentration impurity layer 33. Although it is possible to achieve a certain effect even when Δ<160 nm, Δ may be adjusted to Δ≥160 nm in order to reduce conduction resistance of low-concentration impurity layer 33 while providing a sufficient margin of the breakdown voltage.

[5. Manufacturing Method for Controlling Depths of Gate Trenches Individually]

An example of a manufacturing method for transistor 10 according to Embodiment 1 is described. The description is based on an example in which third gate trench 171 and fourth gate trench 172 are alternately formed.

Figure 12A:
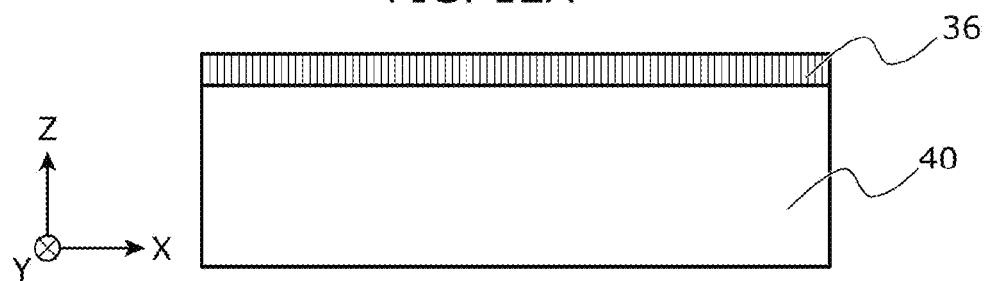
FIG. 12A is a schematic cross-sectional view showing a process of manufacturing the semiconductor device according to Embodiment 1.

As shown in FIG. 12A, mask layer 36 including oxide etc. is formed on a top surface of semiconductor layer 40 (semiconductor substrate 32 and low-concentration impurity layer 33).

Figure 12B:
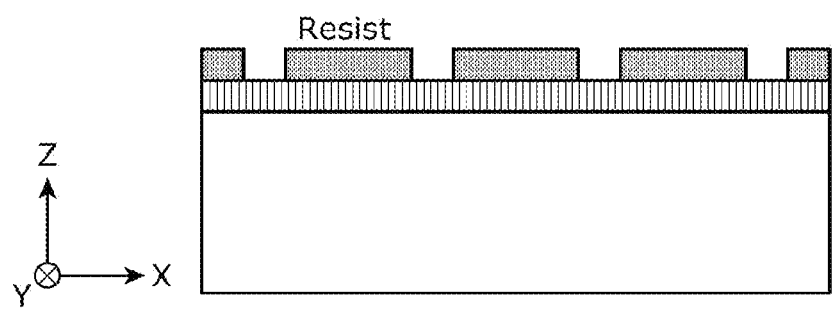
FIG. 12B is a schematic cross-sectional view showing a process of manufacturing the semiconductor device according to Embodiment 1.

Next, as shown in FIG. 12B, a resist applied onto mask layer 36 is patterned, and opening portions are provided at certain distances in the X direction. Here, a width of each of the opening portions of the resist in the X direction eventually becomes an internal width of fourth gate trench 172. Moreover, when transistor 10 is formed to cause internal widths of and distances between third gate trenches 171 and fourth gate trenches 172 to be equal, it is patterned as in FIG. 12B, for a width of each unopened portion in the X direction that are covered with the resist to be approximately three times a width of each opening portion in the X direction where the resist is removed.

Figure 12C:
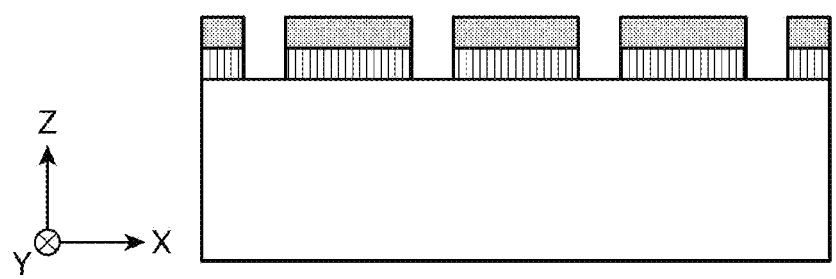
FIG. 12C is a schematic cross-sectional view showing a process of manufacturing the semiconductor device according to Embodiment 1.

Then, as shown in FIG. 12C, mask layer 36 is removed by etching the opening portions of the resist. Although mask layer 36 having a certain thickness may remain on semiconductor layer 40 instead of being entirely removed, mask layer 36 may be entirely removed as shown in FIG. 12C.

Figure 12D:
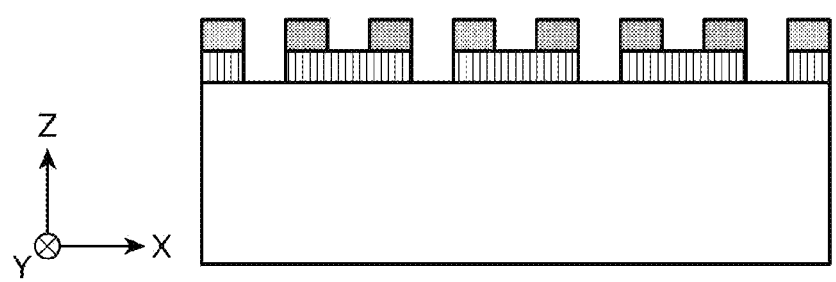
FIG. 12D is a schematic cross-sectional view showing a process of manufacturing the semiconductor device according to Embodiment 1.

After that, as shown in FIG. 12D, the remaining resist is patterned again to provide portions that newly expose mask layer 36 at regular intervals in the X direction. A width of each of opening portions in the X direction that are newly provided in the resist eventually becomes an internal width of third gate trench 171.

Figure 12E:
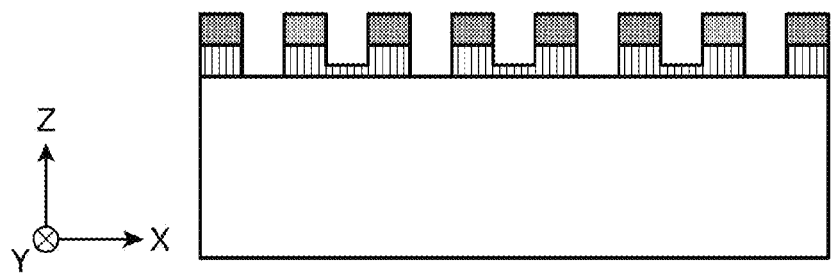
FIG. 12E is a schematic cross-sectional view showing a process of manufacturing the semiconductor device according to Embodiment 1.

Next, as shown in FIG. 12E, mask layer 36 is removed with a certain thickness thereof kept on semiconductor layer 40 by etching the portions that newly expose mask layer 36 in the process shown in FIG. 12D.

Figure 12F:
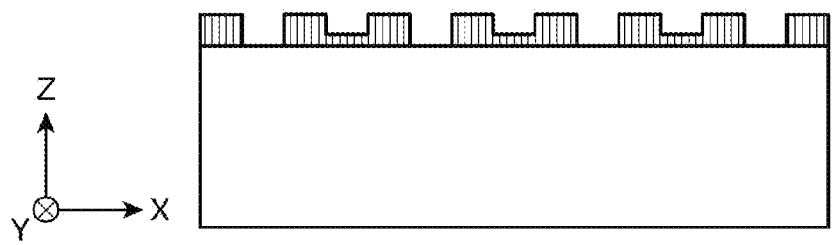
FIG. 12F is a schematic cross-sectional view showing a process of manufacturing the semiconductor device according to Embodiment 1.

Then, as shown in FIG. 12F, the resist is removed.

Figure 12G:
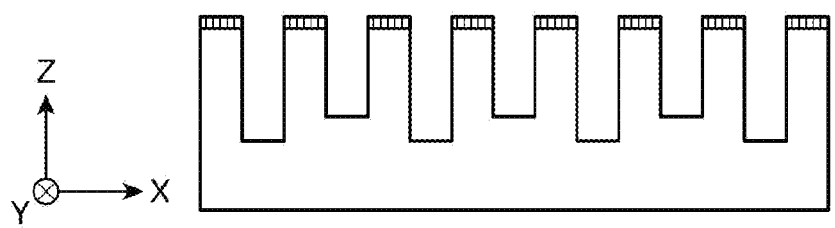
FIG. 12G is a schematic cross-sectional view showing a process of manufacturing the semiconductor device according to Embodiment 1.

After that, as shown in FIG. 12G, mask layer 36 and semiconductor layer 40 are etched using partially remaining mask layer 36 as a mask. At the start of the process shown in FIG. 12G, mask layer 36 is provided selectively and thinly only in portions where they later become third gate trenches 171. When the etching in the process shown in FIG. 12G is performed, the etching of semiconductor layer 40 proceeds from the start in the portions from which mask layer 36 is already removed. In the portions where mask layer 36 remains thin, mask layer 36 is first completely removed, and then the etching of semiconductor layer 40 immediately below subsequently starts. However, since the etching of semiconductor layer 40 has already proceeded in the portions from which mask layer 36 is already removed at that point, trenches having different depths are alternately formed in semiconductor layer 40.

It is possible to control a difference in depth between third gate trenches 171 and fourth gate trenches 172 by controlling, for example, the thickness of mask layer 36, etching conditions, a remaining thickness of mask layer 36 kept on the top surface of semiconductor layer 40 in the process shown in FIG. 12E.

Additionally, controlling dimensions for patterning a resist makes it possible to freely design the internal widths of third gate trenches 171 and the internal widths of fourth gate trenches 172, or distances between third gate trenches 171, distances between fourth gate trenches 172, and distances between third gate trenches 171 and fourth gate trenches 172, etc.

Embodiment 2

Hereinafter, transistor 10A of semiconductor device 1 according to Embodiment 2 that is obtained by changing part of the configuration of transistor 10 of semiconductor device 1 according to Embodiment 1 is described.

Transistor 10 is an example of the configuration in which first gate trenches 17 comprise third gate trenches 171 and fourth gate trenches 172, and include third gate conductors 151 and third gate insulating films 161 of third gate trenches 171, and fourth gate conductors 152 and fourth gate insulating films 162 of fourth gate trenches 172.

In contrast, transistor 10A according to Embodiment 2 is an example of a configuration in which, in transistor 10A according to Embodiment 2, first gate trenches 17 comprise third gate trenches 171 and fourth gate trenches 172, and include third gate conductors 151A and third gate insulating films 161A of third gate trenches 171, and fourth gate conductors 152A and fourth gate insulating films 162A of fourth gate trenches 172.

In the following part, the same constituent elements of transistor 10A according to Embodiment 2 as those of transistor 10 are given the same reference signs, and the detailed description thereof is omitted as being already described. The following mainly focuses on the differences of transistor 10A with respect to transistor 10.

Figure 13:
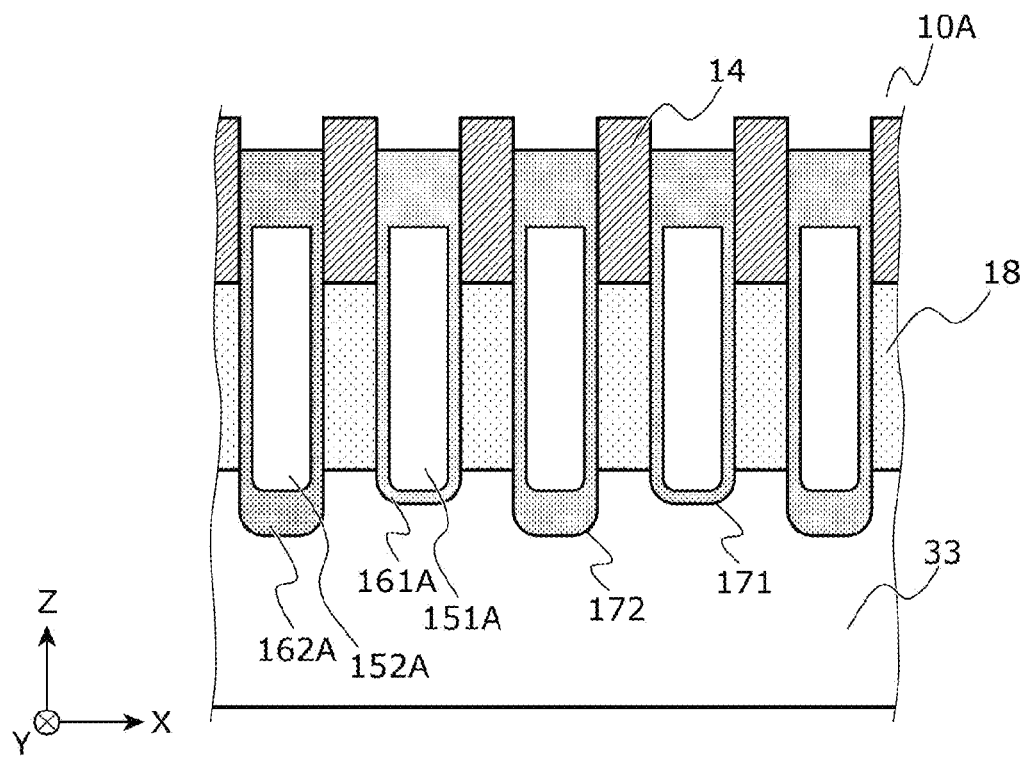
FIG. 13 is a schematic cross-sectional view showing an example of a structure of a first transistor according to Embodiment 2.

FIG. 13 is a schematic diagram illustrating a shape of transistor 10A according to Embodiment 2. FIG. 13 is a schematic diagram when a portion of transistor 10A is cross-sectionally viewed along an X-Z plane. Constituent elements including interlayer insulating layer 34 and above such as first source electrode 11 and constituent elements including semiconductor substrate 32 and below are omitted from the figure.

Embodiment 2 differs from Embodiment 1 in shape of third gate insulating film 161A and fourth gate insulating film 162A. In particular, a portion of fourth gate insulating film 162A on a side closer to a bottom portion of fourth gate trench 172 is thicker than a portion of fourth gate insulating film 162A on a side closer to a top portion of fourth gate trench 172.

As described also in Embodiment 1, since fourth gate trench 172 is a relatively deep trench, electric field strength in a central portion of a tip of fourth gate trench 172 increases. If fourth gate insulating film 162A is extremely thin, the structure does not withstand the increasing electric field strength, which may form a portion in which a current leaks between the drain and the gate. For this reason, only a portion of fourth gate insulating film 162A on the side closer to the bottom portion of fourth gate trench 172 may be thickened to broadly cover the tip of fourth gate trench 172 that is a portion in which the electric field strength especially increases.

Although FIG. 13 shows an example of a configuration in which fourth gate insulating film 162A is uniformly thick on the side closer to the bottom portion of fourth gate trench 172, a configuration that achieves an advantageous effect of Embodiment 2 is not limited to the shape shown in FIG. 13. Only a portion of a lateral surface of fourth gate insulating film 162A and a portion of fourth gate insulating film 162A on the side closer to the bottom portion of fourth gate trench 172 may be thickened to conform to the shape of fourth gate trench 172, or a thickened portion may include a multi-layer configuration of insulating films each containing a different material.

Moreover, as shown in FIG. 13, similarly to third gate insulating film 161 in Embodiment 1, third gate insulating film 161A may have a constant thickness in both a lateral surface and a bottom portion of third gate trench 171. This is because since the electric field strength occurring in the tip of third gate trench 171 does not increase excessively, third gate insulating film 161A need not be thickened. Accordingly, fourth gate insulating film 162A of which tolerance to relatively increasing electric field strength needs to be improved may include a thicker portion compared to third gate insulating film 161A. In particular, the portion of fourth gate insulating film 162A on the side closer to the bottom portion of fourth gate trench 172 may be thickened.

However, the electric field strength in the tip of third gate trench 171 may increase to some extent depending on a difference in depth between third gate trench 171 and fourth gate trench 172, a distance between third gate trench 171 and fourth gate trench 172, or a relative relation of a total number of third gate trenches 171 and fourth gate trenches 172 disposed. In such a case, similarly to fourth gate insulating film 162A, a portion of third gate insulating film 161A on a side closer to a bottom may also be thickened. Here, third gate insulating film 161A and fourth gate insulating film 162A may have the same thickness or fourth gate insulating film 162A may be relatively thicker than third gate insulating film 161A.

Embodiment 3

Hereinafter, transistor 10B of semiconductor device 1 according to Embodiment 3 that is obtained by changing part of the configuration of transistor 10 of semiconductor device 1 according to Embodiment 1 is described.

Transistor 10 is an example of the configuration in which low-concentration impurity layer 33 comprises a single layer. In contrast, transistor 10B according to Embodiment 3 is an example of a configuration in which, in transistor 10B according to Embodiment 3, low-concentration layer 33B includes a two-layer configuration.

In the following part, the same constituent elements of transistor 10B according to Embodiment 3 as those of transistor 10 are given the same reference signs, and the detailed description thereof is omitted as being already described. The following mainly focuses on the differences of transistor 10B with respect to transistor 10.

Figure 14:
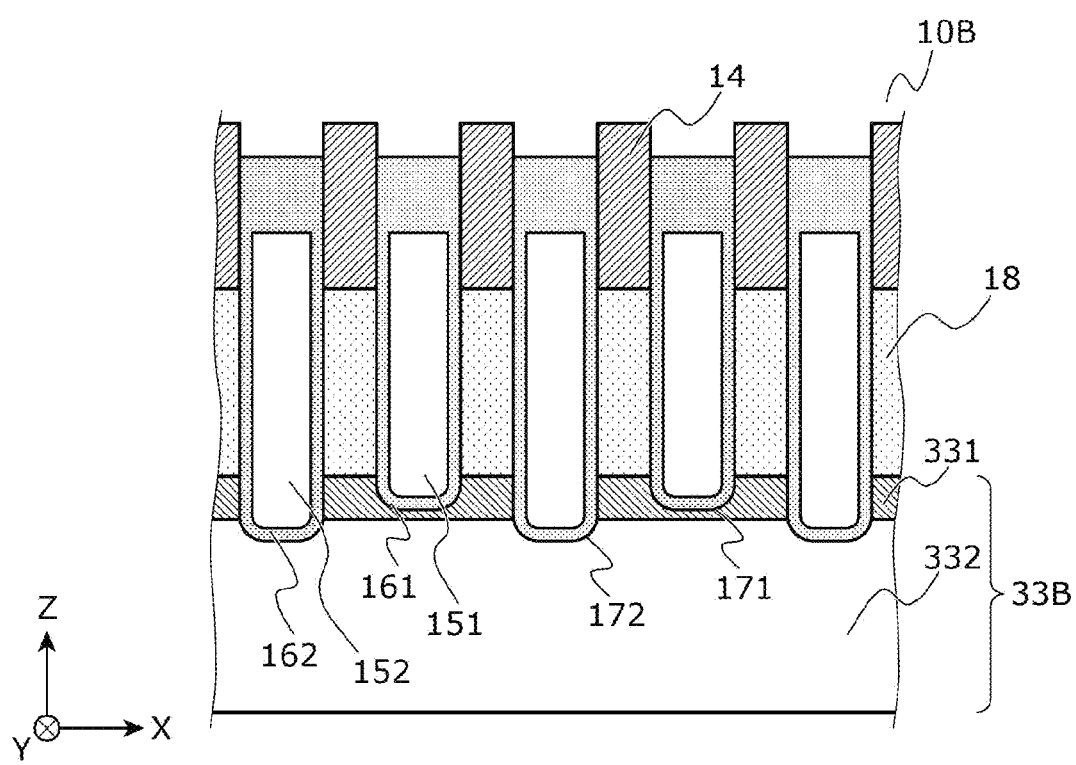
FIG. 14 is a schematic cross-sectional view showing an example of a structure of a first transistor according to Embodiment 3.

FIG. 14 is a schematic diagram illustrating a shape of transistor 10B according to Embodiment 3. FIG. 14 is a schematic diagram when a portion of transistor 10B is cross-sectionally viewed along an X-Z plane. Constituent elements including interlayer insulating layer 34 and above such as first source electrode 11 and constituent elements including semiconductor substrate 32 and below are omitted from the figure.

As shown in FIG. 14, low-concentration impurity layer 33B of transistor 10B includes a two-layer configuration. Low-concentration impurity layer 33B is obtained by first stacking second low-concentration impurity layer 332 on semiconductor substrate 32 not shown in diagram and then stacking first low-concentration impurity layer 331 on an upper portion of second low-concentration impurity layer 332.

First low-concentration impurity layer 331 is a layer showing a resistivity lower than a resistivity of second low-concentration impurity layer 332, and second low-concentration impurity layer 332 is a layer showing a resistivity higher than a resistivity of first low-concentration impurity layer 331. For example, when impurity concentrations are compared inside low-concentration impurity layer 33B, a concentration of impurities of a first conductivity type in first low-concentration impurity layer 331 is higher than a concentration of impurities of the first conductivity type in second low-concentration impurity layer 332.

Moreover, in Embodiment 3, a tip of third gate trench 171 is provided to reach the inside of first low-concentration impurity layer 331. Furthermore, the tip of third gate trench 171 is not provided to penetrate through first low-concentration impurity layer 331 to reach second low-concentration impurity layer 332. Moreover, a tip of fourth gate trench 172 is provided to reach the inside of second low-concentration impurity layer 332. Furthermore, the tip of fourth gate trench 172 is not provided to penetrate through second low-concentration impurity layer 332 to reach semiconductor substrate 32.

When the tip of third gate trench 171 is disposed to stay within the inside of first low-concentration impurity layer 331 as described above, a principal current that flows through a conductive channel provided by third gate trench 171 flows through first low-concentration impurity layer 331 and second low-concentration impurity layer 332 immediately below third gate trench 171 to reach semiconductor substrate 32. Since first low-concentration impurity layer 331 has a relatively low resistivity, it is possible to reduce the resistance of the principal current flowing through low-concentration impurity layer 33.

On the other hand, when first low-concentration impurity layer 331 has a relatively low resistivity, electric field strength occurring in the proximity of the tip of third gate trench 171 increases. However, since the structure disclosed in the present disclosure includes fourth gate trench 172, the electric field strength in the proximity of the tip of third gate trench 171 is already decreased. For this reason, it is possible to offset the increase in electric field strength to some extent. In consideration of both an impact on an increase or decrease in electric field strength in the proximity of the tip of third gate trench 171 and an impact on the resistance of a current flowing through first low-concentration impurity layer 331, it is possible to select the resistivity or thickness of first low-concentration impurity layer 331 appropriately.

When the tip of fourth gate trench 172 is disposed to stay within the inside of second low-concentration impurity layer 332, since second low-concentration impurity layer 332 has a relatively high resistivity, it is possible to decrease electric field strength occurring in the proximity of the tip of fourth gate trench 172. This effect is convenient to reduce a side effect that the electric field strength in the proximity of the tip of fourth gate trench 172 originally increases, whereas the structure disclosed in the present disclosure decreases the electric field strength in the proximity of the tip of third gate trench 171.

On the other hand, a principal current that flows through a conducting channel provided by fourth gate trench 172 flows through second low-concentration impurity layer 332 immediately below fourth gate trench 172 to reach semiconductor substrate 32. Since second low-concentration impurity layer 332 has a relatively high resistivity, the resistance of the principal current flowing through low-concentration impurity layer 33 increases. However, since fourth gate trench 172 is provided relatively deep in the structure disclosed in the present disclosure, it is not necessary to excessively increase a distance over which the principal current flows through second low-concentration impurity layer 332.

In Embodiment 3, it is possible to reduce the respective side effects relating to third gate trench 171 and fourth gate trench 172 that occur in the present disclosure, by causing low-concentration impurity layer 33B to include a two-stage configuration appropriately.

[Supplements]

Although the semiconductor device according to one aspect of the present disclosure has been described based on the embodiments, the present disclosure is not limited to these embodiments. Forms obtained by making various modifications conceived by a person skilled in the art to the embodiments or forms obtained by combining the constituent elements in the different variations may be included in the scope of the one or more aspects of the present disclosure, as long as they do not depart from the essence of the present disclosure.

Moreover, in the present disclosure, the structure of the vertical field-effect transistor is described initially using the dual configuration as the example, and the gate trench of the first transistor and the gate trench of the second transistor are referred to as the first gate trench and the second gate trench, respectively. Although, for the avoidance of confusion, the relatively shallow gate trench and the relatively deep gate trench are consistently described as the third gate trench and the fourth gate trench, respectively, in the present disclosure, the structure of the vertical field-effect transistor that achieves the advantageous effects of the present disclosure is not limited to the dual configuration. Accordingly, it is not always necessary to distinguish between the first transistor and the second transistor, and it is allowed to put the third gate trench and the fourth gate trench into the first gate trench and the second gate trench, respectively.

INDUSTRIAL APPLICABILITY

The semiconductor device including the vertical field-effect transistor according to the present disclosure is broadly usable as a device that controls a conduction state of a current pathway.

The invention claimed is:

1. A semiconductor device that is a facedown mountable, chip-size-package type semiconductor device, the semiconductor device comprising:
    a vertical field-effect transistor including:
        a semiconductor substrate of a first conductivity type that contains an impurity of the first conductivity type;
        a low-concentration impurity layer of the first conductivity type that is disposed on the semiconductor substrate and contains an impurity of the first conductivity type having a concentration lower than a concentration of the impurity of the first conductivity type contained in the semiconductor substrate;
        a body region of a second conductivity type that is disposed in the low-concentration impurity layer, the second conductivity type being different from the first conductivity type;
        a source region of the first conductivity type that is disposed in the body region;
        a source electrode that is electrically connected to the body region and the source region;
        a first gate trench that penetrates through the body region from a top surface of the low-concentration impurity layer to a depth that reaches a portion of the low-concentration impurity layer, includes a portion in contact with the source region, and extends in a first direction parallel to the top surface of the low-concentration impurity layer;
        a second gate trench that penetrates through the body region from the top surface of the low-concentration impurity layer more deeply than the first gate trench, includes a portion in contact with the source region, and extends in the first direction;
        a first gate insulating film that is disposed inside the first gate trench;
        a first gate conductor that is disposed on the first gate insulating film;
        a second gate insulating film that is disposed inside the second gate trench; and
        a second gate conductor that is disposed on the second gate insulating film,
    wherein the first gate conductor and the second gate conductor have a same electric potential,
    when a total number of first gate trenches each of which is the first gate trench is denoted by n, a total number of second gate trenches each of which is the second gate trench is at least 2 and at most n+1, n being an integer greater than or equal to 1, in a second direction that is parallel to the top surface of the low-concentration impurity layer and orthogonal to the first direction, the second gate trench is disposed at each of farthest ends of a region in which the first gate trenches and the second gate trenches are disposed, in the second direction, the region in which the first gate trenches and the second gate trenches are disposed includes unit structures that are provided at regular intervals, the unit structures each being a unit structure in which at least one first gate trench is interposed between a pair of nearest second gate trenches among the second gate trenches, the second gate trenches disposed at the farthest ends of one unit structure are shared among the one unit structure and an adjacent unit structure adjacent to the one unit structure, the adjacent unit structure being included in the unit structures, the first gate trench and the second gate trench are alternately disposed in the second direction, a distance between the first gate trench and the second gate trench in the second direction is constant, and a difference in depth between the first gate trench and the second gate trench is at least 160 nm.

2. A semiconductor device that is a facedown mountable, chip-size-package type semiconductor device, the semiconductor device comprising:
a vertical field-effect transistor including:
a semiconductor substrate of a first conductivity type that contains an impurity of the first conductivity type;
a low-concentration impurity layer of the first conductivity type that is disposed on the semiconductor substrate and contains an impurity of the first conductivity type having a concentration lower than a concentration of the impurity of the first conductivity type contained in the semiconductor substrate;
a body region of a second conductivity type that is disposed in the low-concentration impurity layer, the second conductivity type being different from the first conductivity type;
a source region of the first conductivity type that is disposed in the body region;
a source electrode that is electrically connected to the body region and the source region;
a first gate trench that penetrates through the body region from a top surface of the low-concentration impurity layer to a depth that reaches a portion of the low-concentration impurity layer, includes a portion in contact with the source region, and extends in a first direction parallel to the top surface of the low-concentration impurity layer;
a second gate trench that penetrates through the body region from the top surface of the low-concentration impurity layer more deeply than the first gate trench, includes a portion in contact with the source region, and extends in the first direction;
a first gate insulating film that is disposed inside the first gate trench;
a first gate conductor that is disposed on the first gate insulating film;
a second gate insulating film that is disposed inside the second gate trench; and
a second gate conductor that is disposed on the second gate insulating film, wherein the first gate conductor and the second gate conductor have a same electric potential, when a total number of first gate trenches each of which is the first gate trench is denoted by n, a total number of second gate trenches each of which is the second gate trench is at least 2 and at most n+1, n being an integer greater than or equal to 1, in a second direction that is parallel to the top surface of the low-concentration impurity layer and orthogonal to the first direction, the second gate trench is disposed at each of farthest ends of a region in which the first gate trenches and the second gate trenches are disposed, in the second direction, the region in which the first gate trenches and the second gate trenches are disposed includes unit structures that are provided at regular intervals, the unit structures each being a unit structure in which at least one first gate trench is interposed between a pair of nearest second gate trenches among the second gate trenches, the second gate trenches disposed at the farthest ends of one unit structure are shared among the one unit structure and an adjacent unit structure adjacent to the one unit structure, the adjacent unit structure being included in the unit structures, and the second gate insulating film includes a portion thicker than the first gate insulating film.

3. The semiconductor device according to claim 2,
wherein the second gate insulating film in a lower portion of the second gate trench includes a portion thicker than a portion of the second gate insulating film in an upper portion of the second gate trench.

4. The semiconductor device according to claim 3,
wherein the first gate trench and the second gate trench are alternately disposed in the second direction, and
a distance between the first gate trench and the second gate trench in the second direction is constant.

5. The semiconductor device according to claim 2,
wherein the first gate trench and the second gate trench are alternately disposed in the second direction, and
a distance between the first gate trench and the second gate trench in the second direction is constant.

6. A semiconductor device that is a facedown mountable, chip-size-package type semiconductor device, the semiconductor device comprising:
a vertical field-effect transistor including:
a semiconductor substrate of a first conductivity type that contains an impurity of the first conductivity type;
a low-concentration impurity layer of the first conductivity type that is disposed on the semiconductor substrate and contains an impurity of the first conductivity type having a concentration lower than a concentration of the impurity of the first conductivity type contained in the semiconductor substrate;
a body region of a second conductivity type that is disposed in the low-concentration impurity layer, the second conductivity type being different from the first conductivity type;
a source region of the first conductivity type that is disposed in the body region;
a source electrode that is electrically connected to the body region and the source region;
a first gate trench that penetrates through the body region from a top surface of the low-concentration impurity layer to a depth that reaches a portion of the low-concentration impurity layer, includes a portion in contact with the source region, and extends in a first direction parallel to the top surface of the low-concentration impurity layer;

a second gate trench that penetrates through the body region from the top surface of the low-concentration impurity layer more deeply than the first gate trench, includes a portion in contact with the source region, and extends in the first direction;

a first gate insulating film that is disposed inside the first gate trench;

a first gate conductor that is disposed on the first gate insulating film;

a second gate insulating film that is disposed inside the second gate trench; and a second gate conductor that is disposed on the second gate insulating film, wherein the first gate conductor and the second gate conductor have a same electric potential, when a total number of first gate trenches each of which is the first gate trench is denoted by n, a total number of second gate trenches each of which is the second gate trench is at least 2 and at most n+1, n being an integer greater than or equal to 1, in a second direction that is parallel to the top surface of the low-concentration impurity layer and orthogonal to the first direction, the second gate trench is disposed at each of farthest ends of a region in which the first gate trenches and the second gate trenches are disposed, in the second direction, the region in which the first gate trenches and the second gate trenches are disposed includes unit structures that are provided at regular intervals, the unit structures each being a unit structure in which at least one first gate trench is interposed between a pair of nearest second gate trenches among the second gate trenches, the second gate trenches disposed at the farthest ends of one unit structure are shared among the one unit structure and an adjacent unit structure adjacent to the one unit structure, the adjacent unit structure being included in the unit structures, the low-concentration impurity layer is obtained by stacking a first low-concentration impurity layer and a second low-concentration impurity layer in stated order from a top surface side, the first low-concentration impurity layer having a relatively low concentration of an impurity of the first conductivity type, the second low-concentration impurity layer having a relatively high concentration of an impurity of the first conductivity type, a tip of the first gate trench is located inside the first low-concentration impurity layer, and a tip of the second gate trench is located inside the second low-concentration impurity layer.

7. The semiconductor device according to claim 6, wherein the first gate trench and the second gate trench are alternately disposed in the second direction, and a distance between the first gate trench and the second gate trench in the second direction is constant.

* * * * *